United States Patent
Yamazaki et al.

(10) Patent No.: US 9,130,048 B2
(45) Date of Patent: Sep. 8, 2015

(54) METHOD FOR MANUFACTURING A THIN FILM SEMICONDUCTOR DEVICE

(71) Applicant: Semiconductor Energy Laboratory Co., Ltd., Atsugi-shi, Kanagawa-ken (JP)

(72) Inventors: Shunpei Yamazaki, Setagaya (JP); Motoki Nakashima, Atsugi (JP); Masahiro Takahashi, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 51 days.

(21) Appl. No.: 13/686,246

(22) Filed: Nov. 27, 2012

(65) Prior Publication Data

US 2013/0140553 A1     Jun. 6, 2013

(30) Foreign Application Priority Data

Dec. 1, 2011 (JP) ................. 2011-263751

(51) Int. Cl.
*H01L 21/00* (2006.01)
*H01L 29/786* (2006.01)
*H01L 29/66* (2006.01)

(52) U.S. Cl.
CPC .... *H01L 29/78693* (2013.01); *H01L 29/66969* (2013.01); *H01L 29/7869* (2013.01)

(58) Field of Classification Search
CPC .................................................. H01L 29/7869
USPC .......................................................... 438/104
See application file for complete search history.

(56) References Cited

U.S. PATENT DOCUMENTS

| 5,731,856 | A  | 3/1998 | Kim et al. |
| 5,744,864 | A  | 4/1998 | Cillessen et al. |
| 6,294,274 | B1 | 9/2001 | Kawazoe et al. |

(Continued)

FOREIGN PATENT DOCUMENTS

| EP | 1737044 | A | 12/2006 |
| EP | 2226847 | A | 9/2010 |

(Continued)

OTHER PUBLICATIONS

Toshio Kamiya et al., "Carrier transport properties and electronic structures of amorphous oxide semiconductors: the present status," Solid State Physics, Sep. 1, 2009, vol. 44, No. 9, pp. 621-633, Agne Gijutsu Center.

(Continued)

*Primary Examiner* — Ajay K Arora
(74) *Attorney, Agent, or Firm* — Eric J. Robinson; Robinson Intellectual Property Law Office, P.C.

(57) ABSTRACT

A highly reliable semiconductor device and a method for manufacturing the semiconductor device are provided. The semiconductor device is manufactured with a high yield, so that high productivity is achieved. In a semiconductor device including a transistor in which a source electrode layer and a drain electrode layer are provided over and in contact with an oxide semiconductor film, entry of impurities and formation of oxygen vacancies in an end face portion of the oxide semiconductor film are suppressed. This can prevent fluctuation in the electric characteristics of the transistor which is caused by formation of a parasitic channel in the end face portion of the oxide semiconductor film.

14 Claims, 15 Drawing Sheets

(56) References Cited

U.S. PATENT DOCUMENTS

| | | |
|---|---|---|
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,601,984 B2 | 10/2009 | Sano et al. |
| 7,674,650 B2 | 3/2010 | Akimoto et al. |
| 7,732,819 B2 | 6/2010 | Akimoto et al. |
| 7,791,072 B2 | 9/2010 | Kumomi et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0179199 A1 | 7/2009 | Sano et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0089416 A1 | 4/2011 | Yamazaki et al. |
| 2011/0215325 A1 | 9/2011 | Yamazaki et al. |
| 2011/0215331 A1* | 9/2011 | Yamazaki et al. ............... 257/60 |
| 2012/0132906 A1 | 5/2012 | Yamazaki |
| 2013/0082252 A1 | 4/2013 | Yamazaki |
| 2013/0099230 A1 | 4/2013 | Yamazaki et al. |
| 2013/0099231 A1 | 4/2013 | Tochibayashi et al. |
| 2013/0099233 A1 | 4/2013 | Tochibayashi et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165528 A | 6/2006 |
| JP | 2006-165529 A | 6/2006 |
| WO | WO-2004/114391 | 12/2004 |

OTHER PUBLICATIONS

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

(56) References Cited

OTHER PUBLICATIONS

Hayashi.R et al., "42.1: Invited Paper: Improved Amorphous In—Ga—Zn—O TFTs,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters) , Jun. 17, 1996, vol. 68, No. 25, pp. 3650-3652.

Nakamura.M et al., "The phase relations in the In2O3—Ga2ZnO4—ZnO system at 1350° C.,", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3-ZnGa2O4-ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics) , Feb. 1, 2003, vol. 93, No. 3, pp. 1624-1630.

Asakuma.N et al., "Crystallization and Reduction of Sol-Gel-Derived Zinc Oxide Films by Irradiation with Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.

Nomura.K at al., "Carrier transport in transparent oxide semiconductor with intrinsic structural randomness probed using single-crystalline InGaO3(ZnO)5 films,", Appl. Phys. Lett. (Applied Physics Letters) , Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFT,", SID Digest '08: SID International Symposium Digest of Technical Paper, May 20, 2008, vol. 39, pp. 633-636.

Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MoO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits, 2008, vol. 43, No. 1, pp. 292-299.

Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition: The "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane,", SID Digest '09: SID International Symposium Digest of Technical Papers, May 31, 2009, pp. 280-283.

Lee.M et al., "15.4:Excellent Performance of Indium—Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTs,", IDW '09 : Proceedings of the 16th International Display Workshops, 2009, pp. 689-692.

Park.J et al., "Amorphous Indium—Gallium—Zinc Oxide TFTs and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by PEALD Grown ZnO TFT,", IMID '07 Digest, 2007, pp. 1249-1252.

Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.

Osada.T et al., "Development of Driver-Integrated Panel Using Amorphous In—Ga—Zn—Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDs,", Journal of The SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT,", SID Digest '09 : SID International Symposium Digest of Technical Eng Papers, May 31, 2009, pp. 1110-1112.

Ohara.H et al., "21.3:4.0 In. QVGA AMOLED Display Using In—Ga—Zn—Oxide TFTs With a Novel Passivation Layer,", SID Digest '09 : SID International Symposium Digest of Technical Papers, May 31, 2009, pp. 284-287.

Miyasaka.M, "SUFTLA Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.

(56) References Cited

OTHER PUBLICATIONS

Lee.H et al., "Current Status of, Challenges to, and Perspective View of AM-OLED,", IDW '06 : Proceedings of The 13th International Display Workshops, Dec. 7, 2006, pp. 663-666.

Kikuchi.H et al., "62.2:Invited Paper:Fast Electro-Optical Switching in Polymer-Stabilized Liquid Crystsalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N et al., "Spinel,YbFe2O4, andYb2Fe3O7 Types of Structures for Compounds in the IN2O3 and SC2O3—A2O3—BO Systems [A; Fe, Ga, or Al; B: Mg, Mn, Fe, Ni, Cu, or Zn] at Temperatures over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Paper, 2008, vol. 39, pp. 1277-1280.

Janotti.A at al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B.(Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

\* cited by examiner

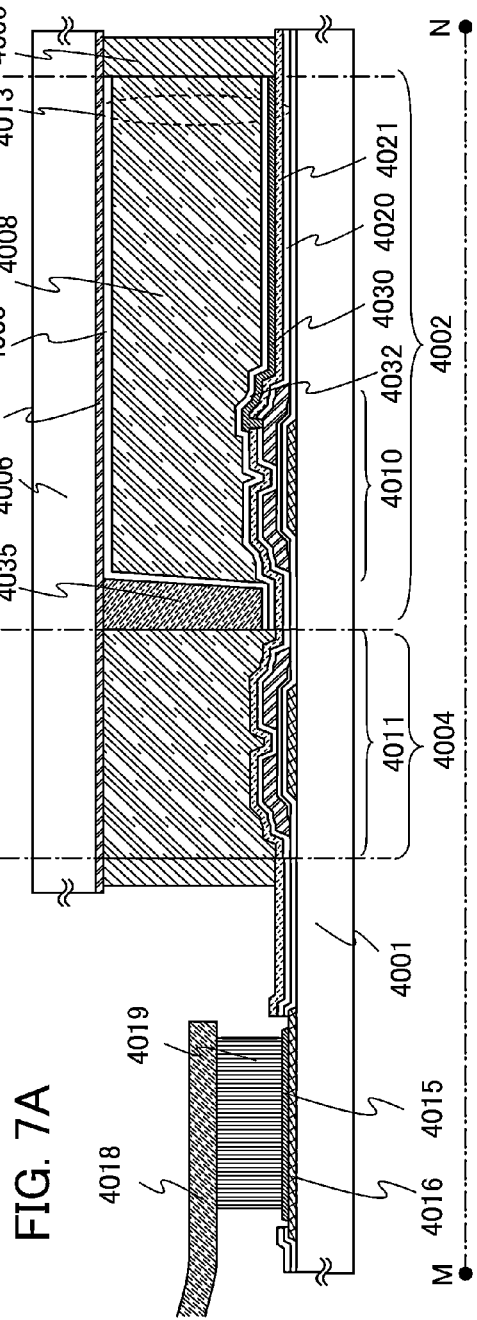
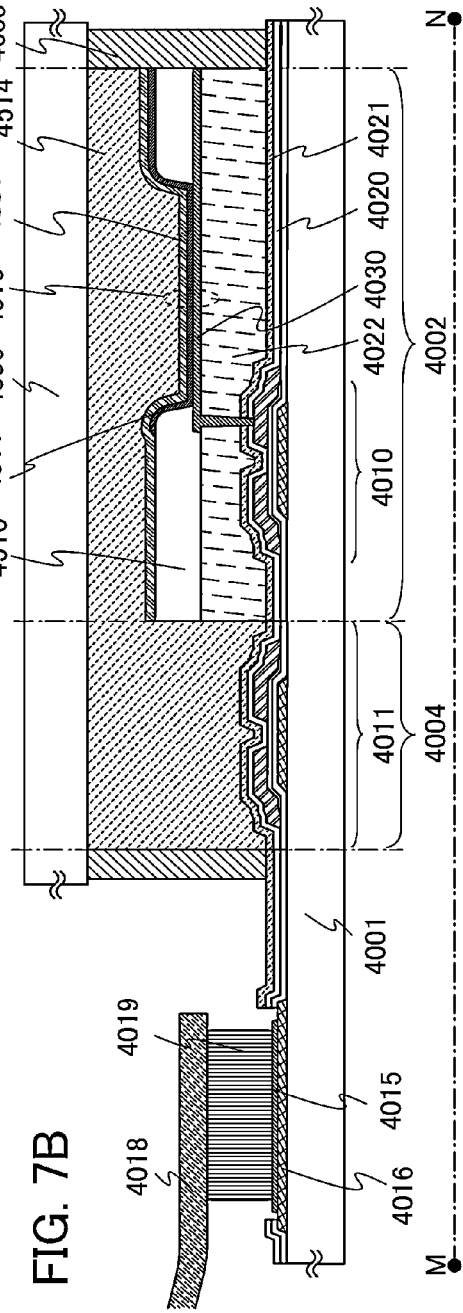
FIG. 7A
FIG. 7B b (100)

c (10-1)

METHOD FOR MANUFACTURING A THIN FILM SEMICONDUCTOR DEVICE

BACKGROUND OF THE INVENTION

1. Field of the Invention

The present invention relates to a semiconductor device and a method for manufacturing the semiconductor device.

In this specification, a semiconductor device generally means a device which can function by utilizing semiconductor characteristics, and an electro-optical device, a semiconductor circuit, and electronic equipment are all semiconductor devices.

2. Description of the Related Art

A technique by which a transistor is formed using a semiconductor thin film formed over a substrate having an insulating surface has been attracting attention. The transistor is applied to a wide range of electronic devices such as an integrated circuit (IC) and an image display device (also simply referred to as a display device). A silicon-based semiconductor material is widely known as a material for a semiconductor thin film applicable to a transistor. As another material, an oxide semiconductor has been attracting attention.

For example, a transistor including a semiconductor thin film which includes an amorphous oxide containing indium (In), gallium (Ga), and zinc (Zn) (an In—Ga—Zn—O-based amorphous oxide) is disclosed (see Patent Document 1). In addition, Patent Document 2 discloses a technique by which a transistor similar to that in Patent Document 1 is manufactured and used as a switching element or the like in a pixel of a display device.

In addition, as for such an oxide semiconductor used in a transistor, there is also description as follows: an oxide semiconductor is insensitive to impurities, there is no problem when a considerable amount of metal impurities are contained in a film, and soda-lime glass which contains a large amount of alkali metals such as sodium and is inexpensive can also be used (see Non-Patent Document 1).

REFERENCE

Patent Document

[Patent Document 1] Japanese Published Patent Application No. 2006-165529
[Patent Document 2] Japanese Published Patent Application No. 2006-165528

Non-Patent Document

[Non-Patent Document 1] Kamiya, Nomura, and Hosono, "Carrier Transport Properties and Electronic Structures of Amorphous Oxide Semiconductors: The present status", *KOTAI BUTSURI (SOLID STATE PHYSICS)*, 2009, Vol. 44, pp. 621-633

SUMMARY OF THE INVENTION

However, when a device structure and a manufacturing process of a transistor including an oxide semiconductor are designed on the basis of the recognition that an oxide semiconductor is insensitive to impurities, there occurs a problem in that the transistor exhibits abnormal electric characteristics. For example, in a curve showing the current-voltage characteristics of the transistor, current rises at a gate voltage lower than the original threshold voltage and is once stabilized, then rising again at the original threshold voltage; thus, the curve has a hump.

In view of the above problem, it is an object to provide a transistor including an oxide semiconductor and having favorable transistor characteristics. Further, it is an object to provide a highly reliable semiconductor device which includes a transistor including an oxide semiconductor.

It is another object to manufacture a highly reliable semiconductor device with a high yield to achieve high productivity.

In a semiconductor device including a transistor in which a source electrode layer and a drain electrode layer are provided over and in contact with an oxide semiconductor film, entry of impurities and formation of oxygen vacancies in an end face portion of the oxide semiconductor film are suppressed. This can prevent fluctuation in the electric characteristics of the transistor which is caused by formation of a parasitic channel in the end face portion of the oxide semiconductor film. Specifically, the following structure can be employed, for example.

One embodiment of the disclosed invention is a method for manufacturing a semiconductor device, including the steps of forming a gate electrode layer over a substrate having an insulating surface; forming a gate insulating film over the gate electrode layer; forming an island-shaped oxide semiconductor film having a tapered end face portion over the gate insulating film; forming a conductive film covering the island-shaped oxide semiconductor film; processing the conductive film by a plasma treatment using an etching gas containing halogen to form a source electrode layer and a drain electrode layer overlapping with at least part of the gate electrode layer; performing an impurity removal treatment on an exposed region of the end face portion of the island-shaped oxide semiconductor film to remove an element contained in the etching gas; performing a first oxygen addition treatment on the exposed region of the end face portion of the island-shaped oxide semiconductor film; and forming a first protective insulating film covering the island-shaped oxide semiconductor film, the source electrode layer, and the drain electrode layer.

In the above, a cleaning treatment using a dilute hydrofluoric acid solution or an oxalic acid solution is preferably performed as the impurity removal treatment. Further, a dinitrogen monoxide plasma treatment is preferably performed as the first oxygen addition treatment. The dinitrogen monoxide plasma treatment is preferably performed with a temperature of the substrate having an insulating surface set higher than or equal to 350° C. and lower than or equal to 400° C.

A film including silicon oxide or a film including silicon oxynitride is preferably used as the first protective insulating film. A second oxygen addition treatment is preferably performed after the formation of the first protective insulating film. A second protective insulating film including aluminum oxide is preferably provided to cover the first protective insulating film after the second oxygen addition treatment.

Another embodiment of the disclosed invention is a semiconductor device including a gate electrode layer over a substrate having an insulating surface; a gate insulating film over the gate electrode layer; an island-shaped oxide semiconductor film having a tapered end face portion over the gate insulating film; a source electrode layer and a drain electrode layer provided over the island-shaped oxide semiconductor film to overlap with at least part of the gate electrode layer; and a first protective insulating film over the island-shaped oxide semiconductor film, the source electrode layer, and the drain electrode layer. A chlorine concentration in a region of the end face portion of the island-shaped oxide semiconductor film which does not overlap with the source electrode layer or the drain electrode layer is preferably lower than or equal to $5\times10^{18}$ atoms/cm$^3$.

In the above, a fluorine concentration, a boron concentration, and a nitrogen concentration in the region of the end face portion of the island-shaped oxide semiconductor film which does not overlap with the source electrode layer or the drain electrode layer are preferably lower than or equal to $5\times10^{18}$ atoms/cm$^3$, lower than or equal to $1\times10^{16}$ atoms/cm$^3$, and lower than or equal to $1\times10^{17}$ atoms/cm$^3$, respectively.

A chlorine concentration, a fluorine concentration, and a boron concentration in a region of the end face portion of the island-shaped oxide semiconductor film which overlaps with the source electrode layer and the drain electrode layer may be lower than those in the region of the end face portion of the island-shaped oxide semiconductor film which does not overlap with the source electrode layer or the drain electrode layer.

The above semiconductor device preferably includes a film including silicon oxide or a film including silicon oxynitride as the first protective insulating film, and preferably includes a second protective insulating film including aluminum oxide over the first protective insulating film.

In this specification and the like, the term such as "electrode" or "wiring" does not limit a function of a component. For example, an "electrode" is sometimes used as part of a "wiring", and vice versa. Furthermore, the term "electrode" or "wiring" can include the case where a plurality of "electrodes" or "wirings" is formed in an integrated manner.

Functions of a "source" and a "drain" are sometimes replaced with each other when a transistor of opposite polarity is used or when the direction of current flowing is changed in circuit operation, for example. Therefore, the terms "source" and "drain" can be replaced with each other in this specification.

Note that in this specification and the like, the term "electrically connected" includes the case where components are connected through an object having any electric function. There is no particular limitation on an object having any electric function as long as electric signals can be transmitted and received between components that are connected through the object. Examples of an "object having any electric function" are a switching element such as a transistor, a resistor, an inductor, a capacitor, and an element with a variety of functions as well as an electrode and a wiring.

A transistor including an oxide semiconductor and having favorable transistor characteristics is provided. A highly reliable semiconductor device which includes a transistor including an oxide semiconductor is provided.

Further, a highly reliable semiconductor device is manufactured with a high yield, so that high productivity is achieved.

BRIEF DESCRIPTION OF THE DRAWINGS

FIGS. 7A and 7B are cross-sectional views each illustrating one embodiment of a semiconductor device.

DETAILED DESCRIPTION OF THE INVENTION

Hereinafter, embodiments of the invention disclosed in this specification will be described in detail with reference to the accompanying drawings. Note that the invention disclosed in this specification is not limited to the following description, and it is easily understood by those skilled in the art that modes and details can be variously changed without departing from the spirit and the scope of the invention. Therefore, the invention disclosed in this specification is not construed as being limited to the description of the following embodiments. Note that the ordinal numbers such as "first" and "second" in this specification are used for convenience and do not denote the order of steps or the stacking order of layers. In addition, the ordinal numbers in this specification do not denote particular names which specify the present invention.

(Embodiment 1)

In this embodiment, one embodiment of a semiconductor device and a method for manufacturing the semiconductor device will be described with reference to FIGS. 1A to 1C, FIGS. 2A to 2D, FIGS. 3A to 3D, and FIGS. 4A to 4C. In this embodiment, a transistor including an oxide semiconductor film will be described as an example of the semiconductor device.

The transistor may have a single-gate structure, a double-gate structure, or a triple-gate structure. Alternatively, the transistor may have a dual-gate structure including two gate electrode layers positioned above and below a channel formation region with a gate insulating film provided therebetween.

Figure 1A:
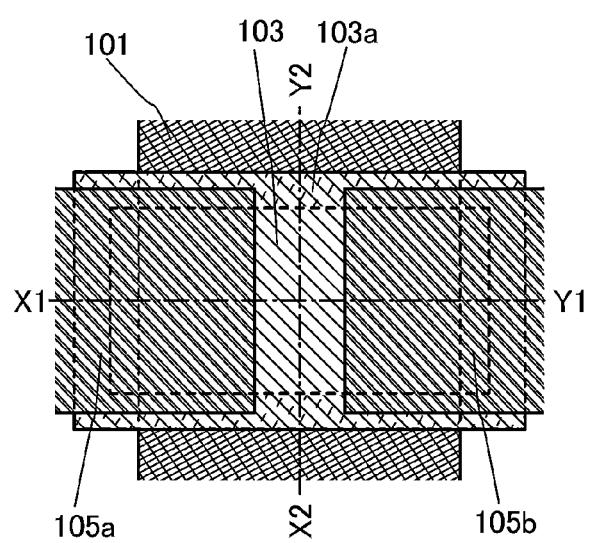
FIGS. 1A to 1C are a plan view and cross-sectional views which illustrate one embodiment of a semiconductor device.
Figure 1C:
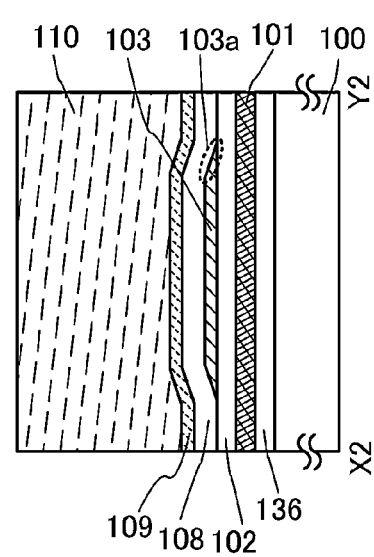
Figure 1B:
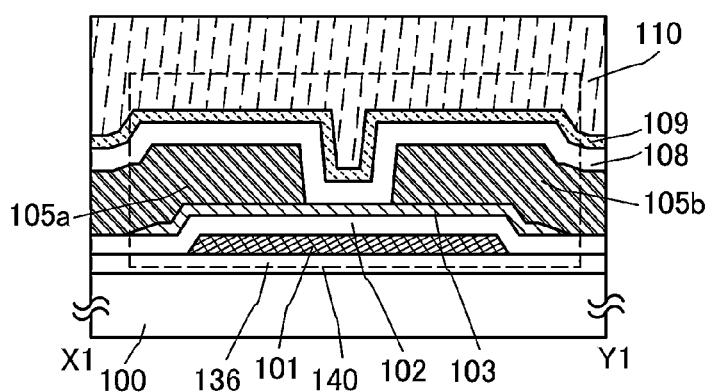

A transistor 140 illustrated in FIGS. 1A to 1C is an example of an inverted staggered transistor that is one type of a bottom-gate transistor. FIG. 1A is a plan view of the transistor 140. FIG. 1B is a cross-sectional view taken along line X1-Y1 in FIG. 1A. FIG. 1C is a cross-sectional view taken along line X2-Y2 in FIG. 1A.

The transistor 140 in FIGS. 1A to 1C includes a gate electrode layer 101 over a substrate 100 having an insulating surface, a gate insulating film 102 over the gate electrode layer 101, an island-shaped oxide semiconductor film 103 having a tapered end face portion over the gate insulating film 102, and a source electrode layer 105a and a drain electrode layer 105b provided over the island-shaped oxide semiconductor film 103 to overlap with at least part of the gate electrode layer 101. The transistor 140 may further include, as its component, a base insulating film 136 which is provided over the substrate 100. In addition, the transistor 140 may further include, as its components, a first protective insulating film 108, a second protective insulating film 109, and a planarization insulating film 110 which are provided over the oxide semiconductor film 103, the source electrode layer 105a, and the drain electrode layer 105b.

As illustrated in FIGS. 1B and 1C, the oxide semiconductor film 103 has a tapered end face portion, whose taper angle can be set as appropriate. For example, the taper angle can be set within 20° to 50°. Note that the taper angle is a tilt angle formed by a side surface and a bottom surface of a film having a tapered shape (e.g., the oxide semiconductor film 103) in the case where the film is observed from a direction perpendicular to a cross section (a plane perpendicular to the surface of a substrate). Note that a quadrangle which is inside the oxide semiconductor film 103 in FIG. 1A and whose shape is similar to the external shape of the oxide semiconductor film 103 is depicted by a dotted line which corresponds to the boundary line between the tapered end face portion of the oxide semiconductor film 103 and a planar surface of the oxide semiconductor film 103 on the inner side than the tapered end face portion.

An oxide semiconductor used for the oxide semiconductor film 103 contains at least indium (In), zinc (Zn), or tin (Sn). In particular, In and Zn are preferably contained. As a stabilizer for reducing variation in electric characteristics of a transistor including the oxide semiconductor, gallium (Ga) is preferably additionally contained. Sn is preferably contained as a stabilizer. Hafnium (Hf) is preferably contained as a stabilizer. Zirconium (Zr) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, for example, indium oxide; tin oxide; zinc oxide; a two-component metal oxide such as an In—Zn-based oxide, or an In—Ga-based oxide; a three-component metal oxide such as an In—Ga—Zn-based oxide (also referred to as IGZO), an In—Sn—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; or a four-component metal oxide such as an In—Sn—Ga—Zn-based oxide, an In—Hf—Ga—Zn-based oxide, or an In—Sn—Hf—Zn-based oxide can be used.

Note that here, for example, an "In—Ga—Zn-based oxide" means an oxide containing In, Ga, and Zn as its main components and there is no particular limitation on the ratio of In:Ga:Zn. The In—Ga—Zn-based oxide may contain a metal element other than the In, Ga, and Zn.

A material represented by $InMO_3(ZnO)_m$ (m>0, where m is not an integer) may be used as the oxide semiconductor. Note that M represents one or more metal elements selected from Ga, Fe, Mn, and Co. Alternatively, a material represented by $In_2SnO_5(ZnO)_n$ (n>0, where n is an integer) may be used as the oxide semiconductor.

For example, an In—Ga—Zn-based oxide with an atomic ratio of In:Ga:Zn=1:1:1 (=1/3:1/3:1/3), In:Ga:Zn=2:2:1 (=2/5:2/5:1/5), or In:Ga:Zn=3:1:2 (=1/2:1/6:1/3), or an oxide with an atomic ratio in the neighborhood of the above atomic ratios can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or an oxide with an atomic ratio in the neighborhood of the above atomic ratios may be used.

However, without limitation to the materials given above, a material with an appropriate composition may be used as the oxide semiconductor depending on needed semiconductor characteristics (e.g., mobility, threshold voltage, and variation). In order to obtain the needed semiconductor characteristics, it is preferable that the carrier density, the impurity concentration, the defect density, the atomic ratio between a metal element and oxygen, the interatomic distance, the density, and the like be set to appropriate values.

For example, high mobility can be obtained relatively easily in the case of using an In—Sn—Zn-based oxide. However, mobility can be increased by reducing the defect density in a bulk also in the case of using an In—Ga—Zn-based oxide.

For example, in the case where the composition of an oxide containing In, Ga, and Zn at the atomic ratio, In:Ga:Zn=a:b:c (a+b+c=1), is in the neighborhood of the composition of an oxide containing In, Ga, and Zn at the atomic ratio, In:Ga:Zn=A:B:C (A+B+C=1), a, b, and c satisfy the following relation: $(a-A)^2+(b-B)^2+(c-C)^2 \leq r^2$, and r may be 0.05, for example. The same applies to other oxides.

The oxide semiconductor film 103 is preferably highly purified by sufficient removal of impurities such as hydrogen or sufficient supply with oxygen so as to be supersaturated with oxygen. Specifically, the hydrogen concentration in the oxide semiconductor film 103 is lower than or equal to $5 \times 10^{19}$ atoms/cm$^3$, preferably lower than or equal to $5 \times 10^{18}$ atoms/cm$^3$, further preferably lower than or equal to $5 \times 10^{17}$ atoms/cm$^3$. Note that the hydrogen concentration in the oxide semiconductor film 103 is measured by secondary ion mass spectrometry (SIMS).

The oxide semiconductor film 103 immediately after being formed is preferably in a supersaturated state in which the proportion of oxygen is higher than that in the stoichiometric composition. In order to sufficiently supply oxygen to supersaturate the oxide semiconductor film 103 with oxygen, an insulating film containing excess oxygen (such as a $SiO_x$ film) is preferably provided so as to cover and be in contact with the oxide semiconductor film 103. In this embodiment, the gate insulating film 102 and the first protective insulating film 108 preferably contain excess oxygen.

The oxide semiconductor film 103 is in a single crystal state, a polycrystalline (also referred to as polycrystal) state, an amorphous state, or the like.

The oxide semiconductor film 103 is preferably a c-axis aligned crystalline oxide semiconductor (CAAC-OS) film.

The CAAC-OS film is not completely single crystal nor completely amorphous. The CAAC-OS film is an oxide semiconductor film with a crystal-amorphous mixed phase structure where crystal parts are included in an amorphous phase. Note that in most cases, the crystal part fits inside a cube whose one side is less than 100 nm. From an observation image obtained with a transmission electron microscope (TEM), a boundary between an amorphous part and a crystal part in the CAAC-OS film is not clear. Further, with the TEM, a grain boundary in the CAAC-OS film is not found. Thus, in the CAAC-OS film, a reduction in electron mobility, due to the grain boundary, is suppressed.

In each of the crystal parts included in the CAAC-OS film, a c-axis is aligned in a direction parallel to a normal vector of a surface where the CAAC-OS film is formed or a normal vector of a surface of the CAAC-OS film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a simple term "perpendicular" includes a range from 85° to 95°. In addition, a simple term "parallel" includes a range from −5° to 5°.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the oxide semiconductor film is higher than that in the vicinity of the surface where the oxide semiconductor film is formed in some cases. Further, when an impurity is added to the CAAC-OS film, the crystal part in a region to which the impurity is added becomes amorphous in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that when the CAAC-OS film is formed, the direction of c-axis of the crystal part is the direction parallel to a normal vector of the surface where the CAAC-OS film is formed or a normal vector of the surface of the CAAC-OS film. The crystal part is formed by film formation or by performing treatment for crystallization such as heat treatment after film formation.

With the use of the CAAC-OS film in a transistor, change in electric characteristics of the transistor due to irradiation with visible light or ultraviolet light is small. Thus, the transistor has high reliability.

Note that part of oxygen included in the oxide semiconductor film may be substituted with nitrogen.

In an oxide semiconductor having a crystal part such as the CAAC-OS, defects in the bulk can be further reduced and when the surface flatness of the oxide semiconductor is improved, mobility higher than that of an oxide semiconductor in an amorphous state can be obtained. In order to improve the surface flatness, the oxide semiconductor is preferably formed over a flat surface. Specifically, the oxide semiconductor may be formed over a surface with an average surface roughness ($R_a$) of less than or equal to 1 nm, preferably less than or equal to 0.3 nm, further preferably less than or equal to 0.1 nm.

Note that the average surface roughness ($R_a$) is obtained by expanding, into three dimensions, arithmetic mean surface roughness that is defined by JIS B 0601:2001 (ISO4287: 1997) so as to be able to apply it to a curved surface. $R_a$ can be expressed as an "average value of the absolute values of deviations from a reference surface to a specific surface" and is defined by the following formula.

$$Ra = \frac{1}{S_0} \int_{y_1}^{y_2} \int_{x_1}^{x_2} |f(x,y) - Z_0| dx dy \quad \text{[FORMULA 1]}$$

Here, the specific surface is a surface which is a target of roughness measurement, and is a quadrilateral region which is specified by four points represented by the coordinates ($x_1$, $y_1$, $f(x_1, y_1)$), ($x_1$, $y_2$, $f(x_1, y_2)$), ($x_2$, $y_1$, $f(x_2, y_1)$), and ($x_2$, $y_2$, $f(x_2, y_2)$). $S_0$ represents the area of a rectangle which is obtained by projecting the specific surface on the xy plane, and $Z_0$ represents the height of the reference surface (the average height of the specific surface). $R_a$ can be measured using an atomic force microscope (AFM).

Note that since the transistor 140 described in this embodiment is a bottom-gate transistor, the substrate 100, the gate electrode layer 101, and the gate insulating film 102 are located below the oxide semiconductor film 103. Accordingly, planarization treatment such as CMP treatment may be performed after the formation of the gate electrode layer 101 and the gate insulating film 102 to obtain the above flat surface.

The oxide semiconductor film 103 has a thickness greater than or equal to 1 nm and less than or equal to 30 nm (preferably greater than or equal to 5 nm and less than or equal to 10 nm) and can be formed by a sputtering method, a molecular beam epitaxy (MBE) method, a CVD method, a pulse laser deposition method, an atomic layer deposition (ALD) method, or the like as appropriate. The oxide semiconductor film 103 may be formed using a sputtering apparatus which performs deposition with surfaces of a plurality of substrates set substantially perpendicular to a surface of a sputtering target.

When an impurity of halogen such as chlorine (Cl) or fluorine (F), an impurity of a Group 3 or Group 13 element such as boron (B), an impurity of a Group 5 or Group 15 element such as nitrogen (N), or the like enters an oxide semiconductor, electrons serving as carriers might be excessively generated. Further, when the oxide semiconductor does not include enough oxygen and thus has oxygen vacancies, electrons serving as carriers might be excessively generated. When an oxide semiconductor film in which electrons serving as carriers are excessively generated is used in a transistor, the electric characteristics of the transistor are degraded, which results in a decrease in reliability of a semiconductor device including the transistor.

In particular, an end face portion of an oxide semiconductor film which is processed into an island shape is exposed in patterning for forming a source electrode layer and a drain electrode layer over the oxide semiconductor film; thus, an impurity of halogen or the like contained in an etching gas used for the patterning is likely to enter the end face portion. Further, oxygen vacancies are likely to be formed in the end face portion as compared with a top surface of the oxide semiconductor film. Accordingly, in the end face portion of the oxide semiconductor film processed into an island shape, generation of carriers due to entry of impurities or formation of oxygen vacancies occurs relatively easily, and therefore a parasitic channel is likely to be formed.

When carriers are generated in such a manner in the end face portion of the oxide semiconductor film, a parasitic channel is formed in the end face portion at a voltage lower than the original threshold voltage. In that case, in a curve showing current-voltage characteristics of a transistor including the oxide semiconductor film, current rises at a voltage lower than the original threshold voltage because a parasitic channel is formed in the end face portion, and is once stabilized. Then, the original channel of the transistor is formed, so that current rises again at the original threshold voltage. Thus, the curve showing the current-voltage characteristics of the transistor including the oxide semiconductor film has a hump.

Here, FIG. 11, FIG. 12, FIG. 13, and FIG. 14 are used to describe the results of verifying, by means of calculation using models, that oxygen vacancies are easily formed in the end face portion of the oxide semiconductor film as compared with the top surface of the oxide semiconductor film.

Figure 11:
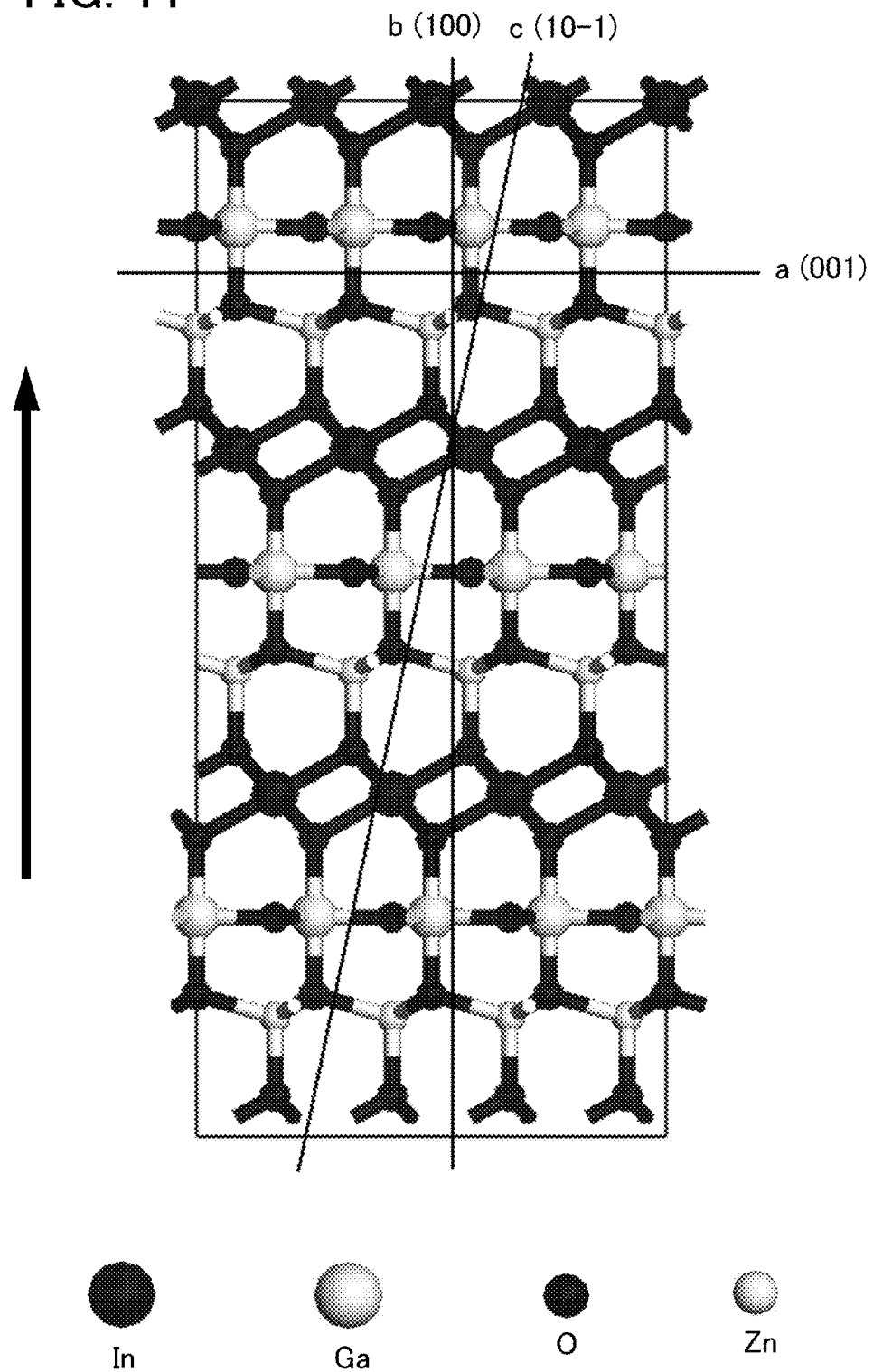
FIG. 11 illustrates a model of InGaZnO$_4$ which is used for calculation.

FIG. 11 shows a model of a c-axis aligned InGaZnO$_4$ single crystal, which was used for the calculation. Here, a large black sphere, a large white sphere, a small black sphere, and a small white sphere in FIG. 11 represent an indium atom, a gallium atom, an oxygen atom, and a zinc atom, respectively. The arrow in FIG. 11 represents the c-axis direction of the InGaZnO$_4$ single crystal.

Figure 12:
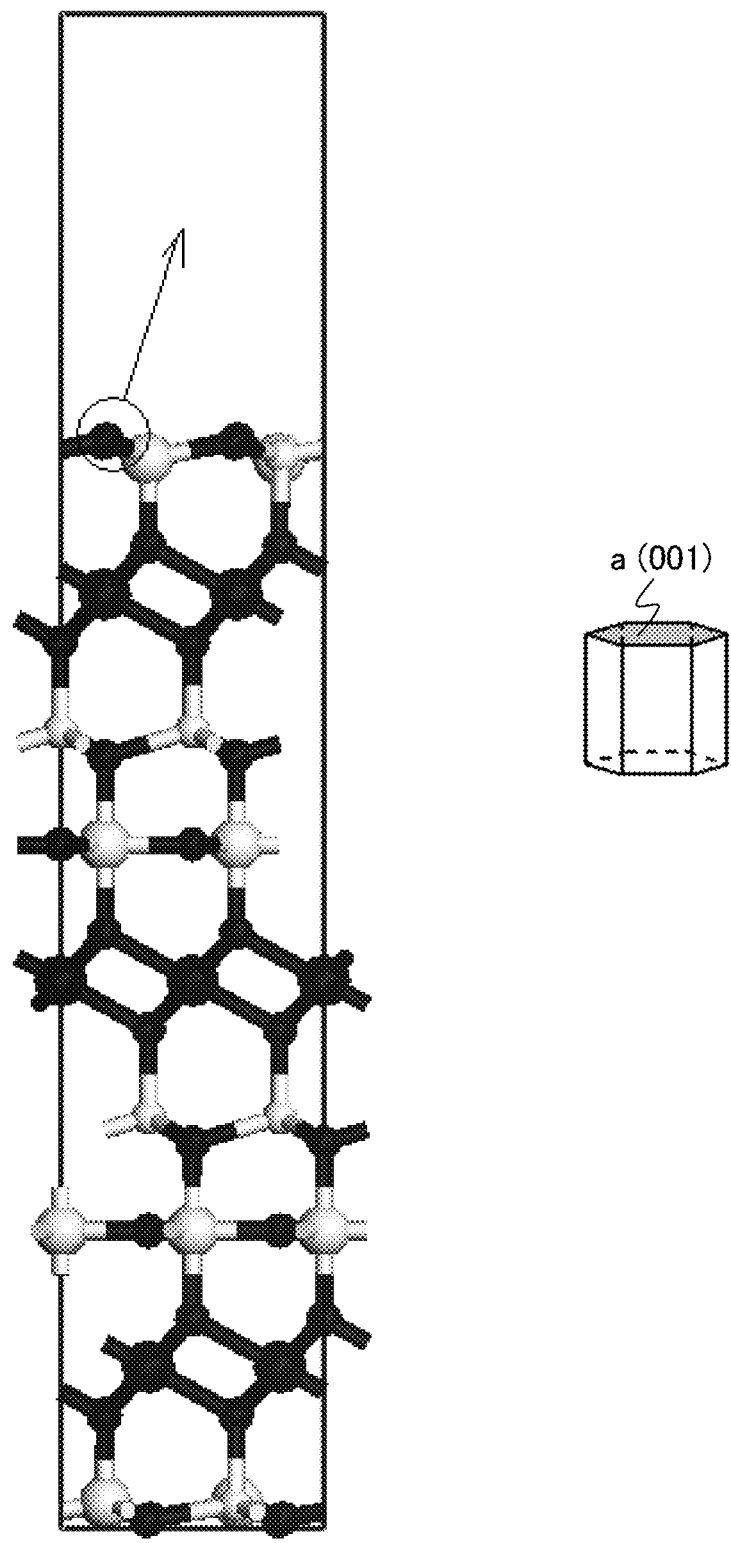
FIG. 12 illustrates a model of InGaZnO$_4$ which is used for calculation.
Figure 13:
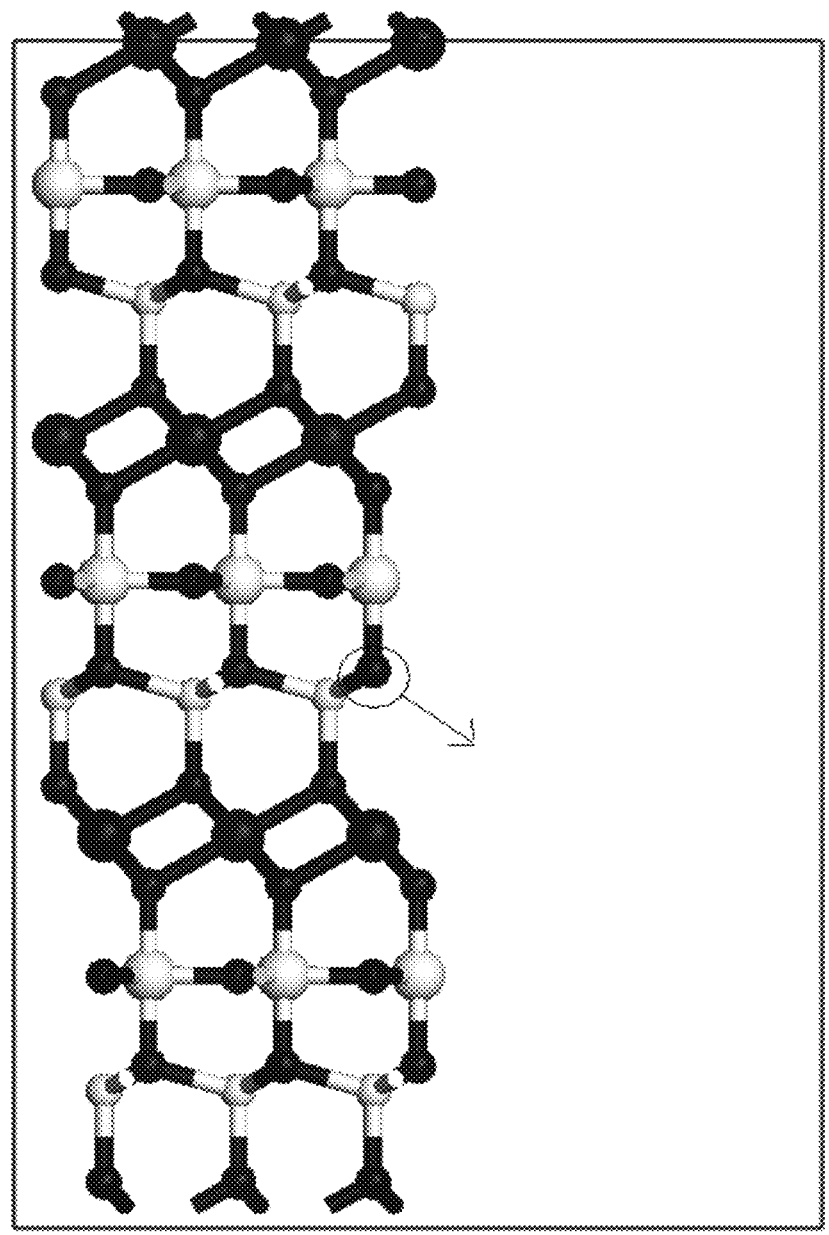
FIG. 13 illustrates a model of InGaZnO$_4$ which is used for calculation.
Figure 13:
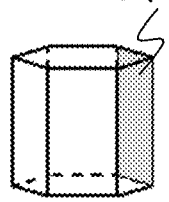
Figure 14:
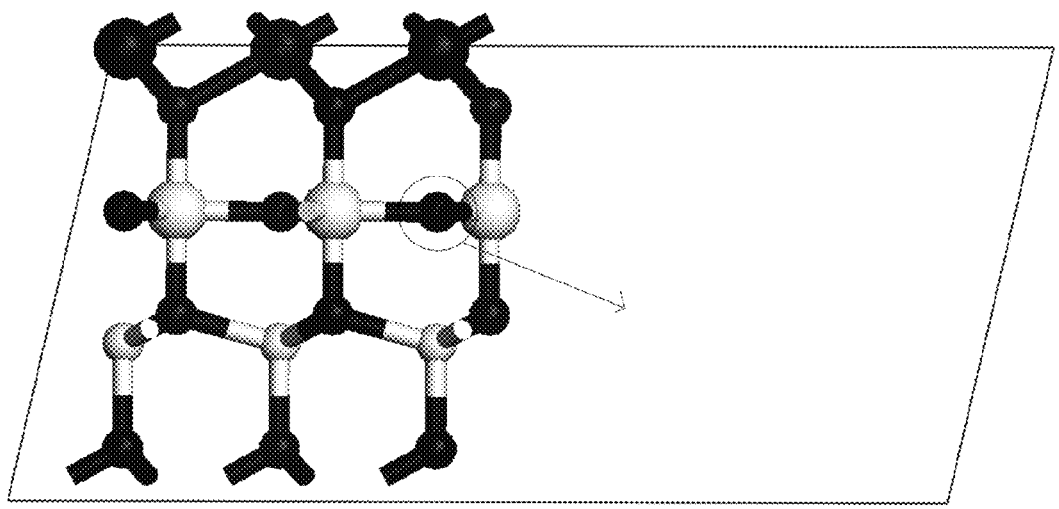
FIG. 14 illustrates a model of InGaZnO$_4$ which is used for calculation.
Figure 14:
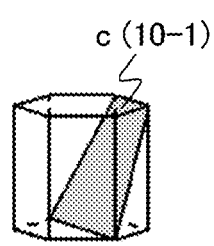

FIG. 12 shows a model which was obtained by cutting the InGaZnO$_4$ single crystal model in FIG. 11 along a section plane "a" (hereinafter referred to as model A). FIG. 13 shows a model which was obtained by cutting the InGaZnO$_4$ single crystal model in FIG. 11 along a section plane "b" (hereinafter referred to as model B). FIG. 14 shows a model which was obtained by cutting the InGaZnO$_4$ single crystal model in FIG. 11 along a section plane "c" (hereinafter referred to as model C). Note that the schematic views in FIG. 12, FIG. 13, and FIG. 14 schematically show the section planes "a" to "c" in the crystal.

Here, the section plane "a" corresponds to the top surface of the oxide semiconductor film, and the section planes "b" and "c" correspond to the end face portions of the oxide semiconductor film. Accordingly, the likelihood of formation of oxygen vacancies can be compared between the top surface and the end face portion by means of calculation using the models A to C.

The section planes "a", "b", and "c" in FIG. 11 were determined so as to include an oxygen atom and correspond to a (001) plane, a (100) plane, and a (10-1) plane, respectively. In other words, surfaces of the models A, B, and C are the (001) plane, the (100) plane, and the (10-1) plane, respectively. Note that the calculation was conducted using a three-dimensional periodic structure; accordingly, the models A to C are slab models having a vacuum region outside the section planes "a" to "c". The models A, B, and C include 84 atoms, 63 atoms, and 21 atoms, respectively.

This calculation also includes calculation on structures in which oxygen is extracted from the section planes "a" to "c" in the models A to C, as shown in FIG. 12, FIG. 13, and FIG. 14. By the extraction of oxygen, dangling bonds corresponding to one Ga atom and two Zn atoms are formed in the model A, dangling bonds corresponding to one Ga atom and two Zn atoms are formed in the model B, and dangling bonds corresponding to three Ga atoms are formed in the model C.

In this calculation, the likelihood of formation of oxygen vacancies on the (001) plane, the (100) plane, and the (10-1) plane of the InGaZnO$_4$ crystal was verified by comparing the energy of the structures of the models A to C with the energy of the structures in which oxygen is extracted from the section planes "a" to "c" in the models A to C.

The calculation was performed using MS-CASTEP, which is a program using the density functional theory. A plane wave basis pseudopotential method was used as a method for the density functional theory, and GGA/PBE was used for a functional. First, the InGaZnO$_4$ single crystal model in FIG. 11 was subjected to structure optimization with a lattice constant fixed. Then, the models A to C were fabricated on the basis of the optimized InGaZnO$_4$ single crystal model. Then, the structures with oxygen vacancies and the structures without oxygen vacancies of the models A to C were subjected to structure optimization with a lattice constant fixed. Energy after the structure optimization was used for the calculation.

Cut-off energy was 400 eV. As for sampling points k, grids of 4×4×1, 1×7×1, and 1×7×3 were used for the models A, B, and C, respectively.

The following calculation was performed on the above models A to C to obtain an energy difference (here, referred to as a bound energy): the energy of the structure with oxygen vacancies and half the energy of an oxygen molecule are added, and the energy of the structure without oxygen vacancies is subtracted therefrom. Oxygen vacancies are more likely to be formed on the surface having a smaller bound energy.

(Bound energy)=(Energy of the structure with oxygen vacancies)+(Half the energy of an oxygen molecule)−(Energy of the structure without oxygen vacancies)    [formula2]

Bound energies of the respective surfaces obtained according to the above formula are shown in Table 1.

TABLE 1

|  | Plane | Dangling bond | Bound energy [eV] |
|---|---|---|---|
| Model A | (001) plane | 1 Ga + 2 Zn | 3.66 |
| Model B | (100) plane | 1 Ga + 2 Zn | 2.52 |
| Model C | (10-1) plane | 3 Ga | 2.53 |

According to the results shown by Table 1, the models B and C have smaller bound energy than the model A. That is, oxygen vacancies are easily formed in the end face portion of the oxide semiconductor film as compared with the top surface of the oxide semiconductor film. Thus, in the end face portion of the oxide semiconductor film processed into an island shape, oxygen vacancies are likely to be formed and generation of carriers due to oxygen vacancies occurs easily.

In view of the above, in the semiconductor device described in this embodiment, an exposed region of a surface of the oxide semiconductor film 103 which does not overlap with the source electrode layer 105a or the drain electrode layer 105b, particularly a region of the end face portion of the oxide semiconductor film 103 which does not overlap with the source electrode layer 105a or the drain electrode layer 105b (hereinafter referred to as a region 103a) illustrated in FIG. 1A is subjected to impurity removal treatment and oxygen addition treatment so as to be purified in the manufacturing process of the transistor 140. Note that details of the impurity removal treatment and the oxygen addition treatment will be described later.

In this manner, entry of an impurity of halogen such as chlorine (Cl) or fluorine (F), an impurity of a Group 3 or Group 13 element such as boron (B), or an impurity of a Group 5 or Group 15 element such as nitrogen (N) and formation of oxygen vacancies can be suppressed in the exposed region of the surface of the oxide semiconductor film 103 which does not overlap with the source electrode layer 105a or the drain electrode layer 105b, particularly in the region 103a. As specific impurity concentrations, the chlorine concentration in the region 103a can be lower than or equal to $5\times10^{18}$ atoms/cm$^3$ (preferably lower than or equal to $1\times10^{18}$ atoms/cm$^3$). The fluorine concentration in the region 103a can be lower than or equal to $5\times10^{18}$ atoms/cm$^3$ (preferably lower than or equal to $1\times10^{18}$ atoms/cm$^3$). The boron concentration in the region 103a can be lower than or equal to $5\times10^{16}$ atoms/cm$^3$ (preferably lower than or equal to $1\times10^{16}$ atoms/cm$^3$). The nitrogen concentration in the region 103a can be lower than $1\times10^{18}$ atoms/cm$^3$ (preferably lower than or equal to $1\times10^{17}$ atoms/cm$^3$). Note that the concentrations of the above impurities (e.g., boron, chlorine, and fluorine) in a region other than the region 103a in the oxide semiconductor film 103 are preferably lower than those in the region 103a.

Further, entry of an impurity such as magnesium, copper, or aluminum is preferably suppressed as well in the exposed region of the surface of the oxide semiconductor film 103 which does not overlap with the source electrode layer 105a or the drain electrode layer 105*b*, particularly in the region 103*a*. When an impurity such as magnesium, copper, or aluminum is scattered in the patterning for forming the source electrode layer 105*a* and the drain electrode layer 105*b* to be attached to the region 103*a*, the impurity generates carriers, which might lead to formation of a parasitic channel. Accordingly, the concentrations of the above impurities are preferably set as follows. The magnesium concentration is set lower than or equal to $1\times10^{17}$ atoms/cm$^3$ (preferably lower than or equal to $1\times10^{16}$ atoms/cm$^3$), the copper concentration is set lower than or equal to $1\times10^{18}$ atoms/cm$^3$ (preferably lower than or equal to $1\times10^{17}$ atoms/cm$^3$), and the aluminum concentration is set lower than or equal to $1\times10^{19}$ atoms/cm$^3$ (preferably lower than or equal to $1\times10^{18}$ atoms/cm$^3$).

Entry of impurities to the oxide semiconductor film 103 is thus suppressed, and further, oxygen vacancies are filled by the oxygen addition treatment, whereby the oxide semiconductor film 103 is put in a supersaturated state in which the proportion of oxygen is higher than that in the stoichiometric composition.

In this manner, impurities and oxygen vacancies in the exposed region of the surface of the oxide semiconductor film 103 which does not overlap with the source electrode layer 105*a* or the drain electrode layer 105*b*, particularly in the region 103*a* are reduced; thus, generation of electrons serving as carriers can be suppressed in the region 103*a*. This can prevent generation of a parasitic channel in the region 103*a* in an off state of the transistor 140, thereby preventing degradation of the electric characteristics of the transistor 140. The transistor 140 can thus have favorable electric characteristics. Further, it is possible to provide a highly reliable semiconductor device including the transistor 140 having favorable electric characteristics.

Next, an example of a method for manufacturing the transistor 140 in FIGS. 1A to 1C is described with reference to cross-sectional views in FIGS. 2A to 2D and FIGS. 3A to 3D. Note that the cross-sectional views on the left side in FIGS. 2A to 2D and FIGS. 3A to 3D correspond to a cross-sectional view taken along X1-Y1, that is, the cross-sectional view in FIG. 1B. The cross-sectional views on the right side correspond to a cross-sectional view taken along X2-Y2, that is, the cross-sectional view in FIG. 1C.

First, the base insulating film 136 is preferably formed over the substrate 100 having an insulating surface.

There is no particular limitation on the substrate that can be used as the substrate 100 having an insulating surface as long as it has heat resistance enough to withstand heat treatment performed later. For example, a glass substrate of barium borosilicate glass, aluminoborosilicate glass, or the like, a ceramic substrate, a quartz substrate, or a sapphire substrate can be used. A single crystal semiconductor substrate or a polycrystalline semiconductor substrate of silicon, silicon carbide, or the like; a compound semiconductor substrate of silicon germanium or the like; an SOI substrate; or the like can be used as the substrate 100. Any of these substrates provided with a semiconductor element may be used as the substrate 100.

The semiconductor device may be manufactured using a flexible substrate as the substrate 100. To manufacture a flexible semiconductor device, the transistor 140 including the oxide semiconductor film 103 may be directly formed over a flexible substrate; or alternatively, the transistor 140 including the oxide semiconductor film 103 may be formed over a manufacturing substrate and then separated and transferred to a flexible substrate. Note that in order to separate the transistor 140 including the oxide semiconductor film from the manufacturing substrate and transfer it to the flexible substrate, a separation layer may be provided between the manufacturing substrate and the transistor 140.

The base insulating film 136 can be formed by a plasma CVD method, a sputtering method, or the like using an oxide having an insulating property such as silicon oxide, silicon oxynitride, aluminum oxide, aluminum oxynitride, hafnium oxide, or gallium oxide; a nitride having an insulating property such as silicon nitride, silicon nitride oxide, aluminum nitride, or aluminum nitride oxide; or a mixed material of any of these materials. Note that in this specification and the like, "silicon oxynitride" contains more oxygen than nitrogen, and "silicon nitride oxide" contains more nitrogen than oxygen.

For example, the base insulating film 136 may have a structure in which a silicon oxynitride film is stacked over a silicon nitride film. By the use of a film containing much nitrogen for the base insulating film 136, diffusion of impurities from the substrate 100 can be prevented. When a glass substrate is used as the substrate 100, diffusion of impurities, such as moisture or metal elements, is particularly remarkable; thus, a film containing much nitrogen is preferably used for the base insulating film 136 in that case.

Note that the base insulating film 136 is not necessarily provided.

The substrate 100 (or the substrate 100 and the base insulating film 136) may be subjected to heat treatment. For example, the heat treatment may be performed at 650° C. for 1 minute to 5 minutes with a gas rapid thermal annealing (GRTA) apparatus, which performs heat treatment using a high-temperature gas. As the high-temperature gas used in GRTA, an inert gas which does not react with a processing object by the heat treatment, such as nitrogen or a rare gas like argon, is used. Alternatively, the heat treatment may be performed with an electric furnace at 500° C. for 30 minutes to 1 hour.

Then, a conductive film is formed over the base insulating film 136 and etched to form the gate electrode layer 101 (including a wiring formed using the gate electrode layer 101). Note that the etching of the conductive film may be dry etching, wet etching, or both dry etching and wet etching.

The gate electrode layer 101 can be formed using a metal material such as molybdenum, titanium, tantalum, tungsten, aluminum, copper, chromium, neodymium, or scandium or an alloy material which contains any of these materials as its main component. Alternatively, a semiconductor film typified by a polycrystalline silicon film doped with an impurity element such as phosphorus, or a silicide film such as a nickel silicide film may be used as the gate electrode layer 101. The gate electrode layer 101 may have a single-layer structure or a stacked-layer structure.

The gate electrode layer 101 can also be formed using a conductive material such as indium oxide-tin oxide, indium oxide containing tungsten oxide, indium zinc oxide containing tungsten oxide, indium oxide containing titanium oxide, indium tin oxide containing titanium oxide, indium oxide-zinc oxide, or indium tin oxide to which silicon oxide is added. It is also possible that the gate electrode layer 101 has a stacked-layer structure of the above conductive material and the above metal material.

As one layer of the gate electrode layer 101 which is in contact with the gate insulating film 102, a metal oxide film containing nitrogen, specifically, an In—Ga—Zn—O film containing nitrogen, an In—Sn—O film containing nitrogen, an In—Ga—O film containing nitrogen, an In—Zn—O film containing nitrogen, a Sn—O film containing nitrogen, an In—O film containing nitrogen, or a metal nitride (e.g., InN or SnN) film can be used. These films each have a work function of 5 eV or higher, preferably 5.5 eV or higher, which enables the threshold voltage of the electric characteristics of the transistor to take a positive value when used for the gate electrode layer, so that a switching element of so-called normally-off type can be provided.

In this embodiment, a tungsten film with a thickness of 100 nm is formed by a sputtering method.

After the formation of the gate electrode layer 101, the substrate 100 and the gate electrode layer 101 may be subjected to heat treatment. For example, the heat treatment may be performed with a GRTA apparatus at 650° C. for 1 minute to 5 minutes. Alternatively, the heat treatment may be performed with an electric furnace at 500° C. for 30 minutes to 1 hour.

Next, the gate insulating film 102 is formed over the gate electrode layer 101.

To improve the coverage with the gate insulating film 102, planarization treatment may be performed on a surface of the gate electrode layer 101. The surface of the gate electrode layer 101 is preferably flat particularly in the case where a thin insulating film is used as the gate insulating film 102.

The gate insulating film 102 can be formed by a sputtering method, an MBE method, a CVD method, a pulsed laser deposition method, an ALD method, or the like as appropriate. The gate insulating film 102 may be formed using a sputtering apparatus which performs deposition with surfaces of a plurality of substrates set substantially perpendicular to a surface of a sputtering target.

The gate insulating film 102 can be formed using a silicon oxide film, a gallium oxide film, an aluminum oxide film, a silicon nitride film, a silicon oxynitride film, an aluminum oxynitride film, or a silicon nitride oxide film. The gate insulating film 102 may have a single-layer structure or a stacked-layer structure.

For example, the gate insulating film 102 may have a structure in which a silicon oxynitride film is stacked over a silicon nitride film. In particular, when the base insulating film 136 is not provided, diffusion of impurities from the substrate 100 can be prevented by the use of a film containing much nitrogen for the gate insulating film 102. When a glass substrate is used as the substrate 100, diffusion of impurities, such as moisture or metal elements, is particularly remarkable; thus, a film containing much nitrogen is preferably used for the gate insulating film 102 in that case. Further, when a film containing a metal element with high diffusibility, such as copper, is used as the gate electrode layer 101, the metal element can be blocked by the use of a film containing much nitrogen for the gate insulating film 102, which is preferable.

The gate insulating film 102 can be formed using a high-k material such as hafnium oxide, yttrium oxide, hafnium silicate ($HfSi_xO_y$ (x>0, y>0)), hafnium silicate to which nitrogen is added ($HfSiO_xN_y$ (x>0, y>0)), hafnium aluminate ($HfAl_xO_y$ (x>0, y>0)), or lanthanum oxide, whereby gate leakage current can be reduced.

It is preferable that the gate insulating film 102 contain oxygen in a portion which is in contact with the oxide semiconductor film 103. In particular, the gate insulating film 102 preferably contains a large amount of oxygen which exceeds at least the amount of oxygen in the stoichiometric composition in the film (bulk). For example, in the case where a silicon oxide film is used as the gate insulating film 102, the composition formula is $SiO_{2+\alpha}$ ($\alpha$>0). Here, oxygen can be introduced into the gate insulating film 102 by an ion implantation method, an ion doping method, a plasma immersion ion implantation method, plasma treatment, or the like.

When the gate insulating film 102 containing much (excess) oxygen, which serves as an oxygen supply source, is provided so as to be in contact with the oxide semiconductor film 103, oxygen can be supplied from the gate insulating film 102 to the oxide semiconductor film 103. Heat treatment is preferably performed in the state where the gate insulating film 102 is at least partly in contact with the oxide semiconductor film 103 to supply oxygen to the oxide semiconductor film 103.

By supply of oxygen to the oxide semiconductor film 103, oxygen vacancies in the film can be filled. Further, the gate insulating film 102 is preferably formed in consideration of the size of a transistor to be formed and the step coverage with the gate insulating film 102.

In this embodiment, a stack of a 50-nm-thick silicon nitride film and a 200-nm-thick silicon oxynitride film is formed by a plasma CVD method.

Here, the hydrogen concentrations of the insulating films (the gate insulating film 102 and the first protective insulating film 108) which are in contact with and supply oxygen to the oxide semiconductor film 103 are important because of their effect on the characteristics of the transistor 140.

An effect of the hydrogen concentration in an insulating film containing excess oxygen upon the characteristics of a transistor is described below.

First, hydrogen was intentionally added to the insulating film containing excess oxygen, and the hydrogen concentration was evaluated by SIMS.

A method for forming a sample is described below.

First, a glass substrate was prepared and a 300-nm-thick silicon oxide film was deposited over the glass substrate by a sputtering method.

The silicon oxide film was deposited using a quartz target at a pressure of 0.4 Pa, a power of 1.5 kW (13.56 MHz), and a substrate temperature of 100° C.

Four samples were prepared. Note that the samples were formed under the same conditions except for the flow rates of an oxygen gas ($O_2$), a heavy hydrogen gas ($D_2$), and an argon gas (Ar) which were used for the deposition of the silicon oxide film.

Table 2 shows sample names, the respective flow rates of the deposition gases used for the deposition of the silicon oxide film, and D (heavy hydrogen atom) concentrations and H (hydrogen) concentrations in the silicon oxide films at a depth of 30 nm. Note that the $D_2$ proportion ($D_2/(O_2+Ar+D_2)$) of the deposition gases for each sample was as follows: 0 vol % for Sample 1; 0.005 vol % for Sample 2; 0.50 vol % for Sample 3; and 2.50 vol % for Sample 4.

TABLE 2

| Sample Name | $O_2$ [sccm] | Ar [sccm] | $D_2$ [sccm] | $D_2$ concentration | D concentration [atoms/cm$^3$] | H concentration [atoms/cm$^3$] |
|---|---|---|---|---|---|---|
| Sample 1 | 25 | 25 | 0 | 0% | 5.1E+15 | 6.4E+19 |
| Sample 2 | 25 | 24.9975 | 0.0025 | 0.005% | 1.6E+19 | 1.4E+20 |
| Sample 3 | 25 | 24.75 | 0.25 | 0.5% | 5.6E+20 | 7.2E+19 |
| Sample 4 | 25 | 23.75 | 1.25 | 2.5% | 7.2E+20 | 1.9E+19 |

Table 2 shows that the D concentration contained in the silicon oxide film became higher as the $D_2$ proportion in the deposition gas was increased.

Next, transistors were fabricated using Samples 1 to 4 shown in Table 2.

Figure 15A:
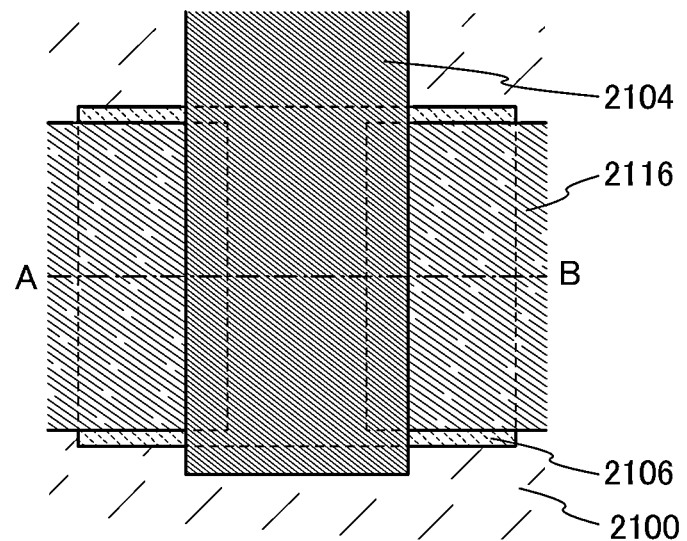
FIGS. 15A and 15B are a plan view and a cross-sectional view illustrating a transistor used for a BT stress test.
Figure 15B:
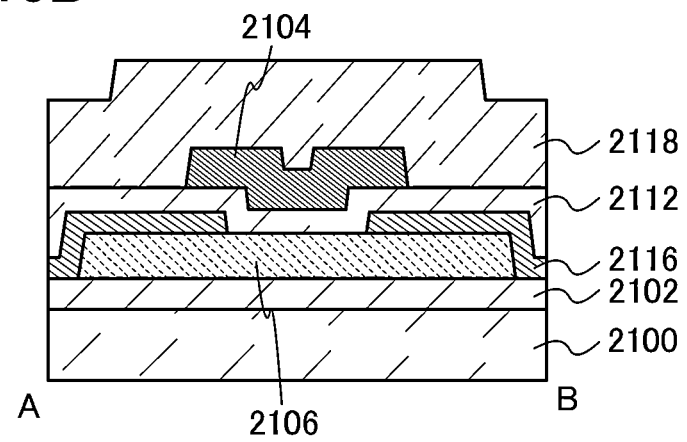

FIG. 15A is a top view of a transistor used for evaluation. FIG. 15B is a cross-sectional view taken along dashed-dotted line A-B in FIG. 15A. Note that a protective insulating film 2118, a gate insulating film 2112, an insulating film 2102, and the like are not illustrated in FIG. 15A for simplification.

The transistor illustrated in FIG. 15B includes a substrate 2100, the insulating film 2102 which contains excess oxygen and is provided over the substrate 2100, an oxide semiconductor film 2106 which is provided over the insulating film 2102, a pair of electrodes 2116 which is provided over the oxide semiconductor film 2106, the gate insulating film 2112 which is provided to cover the oxide semiconductor film 2106 and the pair of electrodes 2116, a gate electrode 2104 which overlaps with the oxide semiconductor film 2106 with the gate insulating film 2112 provided therebetween, and the protective insulating film 2118 which is provided over the gate electrode 2104 and the gate insulating film 2112.

Here, any of Samples 1 to 4 shown in Table 2 was used as the insulating film 2102. Note that the thickness of the insulating film 2102 was 300 nm.

In addition, glass was used as the substrate 2100; a 20-nm-thick IGZO film (deposited using a target having a composition of In:Ga:Zn=1:1:1 [atomic ratio]) was used as the oxide semiconductor film 2106; a 100-nm-thick tungsten film was used as the pair of electrodes 2116; a 30-nm-thick silicon oxynitride film was used as the gate insulating film 2112; a stack of a 15-nm-thick tantalum nitride film and a 135-nm-thick tungsten film which were provided in this order from the gate insulating film 2112 side was used as the gate electrode 2104; and a 300-nm-thick silicon oxynitride film was used as the protective insulating film 2118.

The transistor having such a structure was subjected to a BT stress test. Note that in the transistor used for the measurement, the channel length (L) was 10 µm, the channel width (W) was 10 µm, and the length of a portion (Lov) where the gate electrode 2104 overlaps with each of the pair of electrodes 2116 was 1 µm (2 µm in total). A method of the BT stress test is described below.

First, a drain current (Id) of the transistor was evaluated under the conditions where the substrate temperature was 25° C., the drain voltage (Vd) was 3V, and the gate voltage (Vg) was swept from −6 V to 6V. Characteristic of the transistor at that time is referred to as characteristics of the transistor obtained before the BT stress test.

Next, Vd and Vg were set to 0.1 V and −6 V, respectively, the substrate temperature was set to 150° C., and those conditions were kept for 1 hour.

Next, the applications of Vd and Vg and heating were stopped. Then, Id was evaluated under the conditions where the substrate temperature was 25° C., Vd was 3 V, and Vg was swept from −6V to 6V. Characteristics of the transistor at that time are referred to as characteristics of the transistor obtained after the BT stress test.

Table 3 shows values of threshold voltage (Vth) and values of field-effect mobility ($\mu_{FE}$) which were obtained before and after the BT stress test. Note that sample names in Table 3 correspond to those in Table 2 and indicate the conditions of the insulating film 2102.

TABLE 3

| Sample Name | Before BT stress test | | After BT stress test | |
|---|---|---|---|---|
| | Vth [V] | $\mu_{FE}$ [cm$^2$/Vs] | Vth [V] | $\mu_{FE}$ [cm$^2$/Vs] |
| Sample 1 | 0.94 | 8.6 | 1.17 | 7.8 |
| Sample 2 | 0.82 | 8.6 | 1.03 | 8.2 |
| Sample 3 | 0.89 | 8.8 | 1.05 | 7.8 |
| Sample 4 | 0.71 | 8.7 | 0.43 | 2.5 |

Table 3 shows that the $\mu_{FE}$ of Sample 4 was largely lowered after the BT stress test.

In addition, when the characteristics of transistors with smaller L were evaluated, variations in Vth in a negative direction were large in the case of Sample 4 as compared to the cases of the other samples.

As described above, when the D concentration of the silicon oxide film is $7.2 \times 10^{20}$ atoms/cm$^3$ in the transistor having a structure in which the silicon oxide film is in contact with the oxide semiconductor film, the transistor has abnormal characteristics.

In this manner, when the hydrogen concentration of the insulating film containing excess oxygen is higher than or equal to $7.2 \times 10^{20}$ atoms/cm$^3$, variations in initial characteristics of the transistor are increased, a channel length dependence is increased, and the transistor is significantly deteriorated in the BT stress test. Therefore, the hydrogen concentration of the insulating film containing excess oxygen is set to lower than $7.2 \times 10^{20}$ atoms/cm$^3$. That is, it is preferable that the hydrogen concentration of the oxide semiconductor film is lower than or equal to $5 \times 10^{19}$ atoms/cm$^3$ and the hydrogen concentration of the insulating film containing excess oxygen is lower than $7.2 \times 10^{20}$ atoms/cm$^3$.

Although a top-gate transistor was used in the BT stress test, the above also applies to the transistor 140 in FIGS. 1A to 1C, which is a bottom-gate transistor. That is, the hydrogen concentrations of the gate insulating film 102 and the first protective insulating film 108 are preferably lower than $7.2 \times 10^{20}$ atoms/cm$^3$.

Accordingly, heat treatment may be performed on the substrate 100, the gate electrode layer 101, and the gate insulating film 102 after the formation of the gate insulating film 102 in order to remove excess hydrogen (including water and a hydroxyl group) (to perform dehydration or dehydrogenation treatment). For example, heat treatment may be performed at a temperature higher than or equal to 350° C. and lower than or equal to 450° C. with an electric furnace.

Figure 2A:
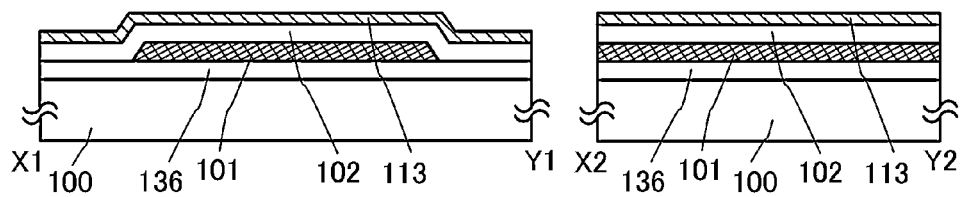
FIGS. 2A to 2D are cross-sectional views illustrating one embodiment of a method for manufacturing a semiconductor device.

Next, an oxide semiconductor film 113 is formed over the gate insulating film 102 (see FIG. 2A).

To prevent the oxide semiconductor film 113 from containing hydrogen or water as much as possible in the step of forming the oxide semiconductor film 113, it is preferable to heat the substrate provided with the gate insulating film 102 in a preheating chamber in a sputtering apparatus as a pretreatment for formation of the oxide semiconductor film 113 so that impurities such as hydrogen and moisture adsorbed on the substrate and the gate insulating film 102 are eliminated and removed. As an exhaustion unit provided in the preheating chamber, a cryopump is preferable.

Planarization treatment may be performed on a region of the gate insulating film 102 which is to be in contact with the island-shaped oxide semiconductor film 103 which is described later. The planarization treatment may be, but not particularly limited to, polishing treatment (such as chemical mechanical polishing (CMP)), dry etching treatment, or plasma treatment.

As plasma treatment, reverse sputtering in which an argon gas is introduced and plasma is generated can be performed. The reverse sputtering is a method in which voltage is applied to a substrate side with use of an RF power source in an argon atmosphere and plasma is generated in the vicinity of the substrate so that a substrate surface is modified. Note that instead of an argon atmosphere, a nitrogen atmosphere, a helium atmosphere, an oxygen atmosphere, or the like may be used. The reverse sputtering can remove particle substances (also referred to as particles or dust) attached to a surface of the gate insulating film 102.

As the planarization treatment, polishing treatment, dry etching treatment, or plasma treatment may be performed plural times, or these treatments may be performed in combination. In the case where the treatments are combined, the order of steps is not particularly limited and may be set as appropriate depending on the roughness of the surface of the gate insulating film 102.

The oxide semiconductor film 113 is preferably formed under a condition such that much oxygen is contained (for example, by a sputtering method in an atmosphere where the proportion of oxygen is 100%) so as to be a film containing much oxygen (preferably including a region containing oxygen in excess of the stoichiometric composition of the oxide semiconductor in a crystalline state).

In this embodiment, a 35-nm-thick In—Ga—Zn-based oxide film (IGZO film) is formed as the oxide semiconductor film 113 by a sputtering method using a sputtering apparatus including an AC power supply device. In this embodiment, an In—Ga—Zn-based oxide target with an atomic ratio of In:Ga:Zn=1:1:1 (=⅓:⅓:⅓) is used. The deposition conditions are as follows: the atmosphere is oxygen, the pressure is 0.6 Pa, the electric power is 5 kW, and the substrate temperature is 170° C. The deposition rate under these deposition conditions is 16 nm/min.

It is preferable that a high-purity gas from which impurities such as hydrogen, water, a hydroxyl group, and hydride are removed be used as a sputtering gas for the formation of the oxide semiconductor film 113.

The substrate is held in a deposition chamber kept under reduced pressure. Then, a sputtering gas from which hydrogen and moisture are removed is introduced into the deposition chamber while moisture remaining therein is removed, and the oxide semiconductor film 113 is formed over the substrate 100 with the use of the above target. In order to remove moisture remaining in the deposition chamber, an entrapment vacuum pump such as a cryopump, an ion pump, or a titanium sublimation pump is preferably used. As an exhaustion unit, a turbo molecular pump provided with a cold trap may be used. In the deposition chamber which is evacuated with the cryopump, for example, a hydrogen atom, a compound containing a hydrogen atom, such as water ($H_2O$), (more preferably, also a compound containing a carbon atom), and the like are evacuated, whereby the concentration of an impurity contained in the oxide semiconductor film 113 deposited in the deposition chamber can be reduced.

It is preferable to form the gate insulating film 102 and the oxide semiconductor film 113 in succession so as not to expose the gate insulating film 102 to the air. Forming the gate insulating film 102 and the oxide semiconductor film 113 in succession so as not to expose the gate insulating film 102 to the air can prevent impurities such as hydrogen and moisture from being adsorbed to the surface of the gate insulating film 102.

The oxide semiconductor film 113 immediately after being formed is preferably in a supersaturated state in which the proportion of oxygen is higher than that in the stoichiometric composition. For example, in the case where the oxide semiconductor film is deposited using a sputtering method, the deposition is preferably performed under the condition where the proportion of oxygen in a deposition gas is high, in particular, in an oxygen atmosphere (oxygen gas: 100%). The deposition under the condition where the proportion of oxygen in a deposition gas is high, in particular, in an atmosphere containing an oxygen gas at 100% can reduce release of Zn from the film even when the deposition temperature is, for example, higher than or equal to 300° C.

Further, heat treatment may be performed on the oxide semiconductor film 113 in order to remove excess hydrogen (including water and a hydroxyl group) (to perform dehydration or dehydrogenation treatment). The temperature of the heat treatment is higher than or equal to 300° C. and lower than or equal to 700° C., or lower than the strain point of the substrate. The heat treatment can be performed under reduced pressure, a nitrogen atmosphere, or the like.

In the case of using a crystalline oxide semiconductor film as the oxide semiconductor film 113, heat treatment for crystallization may be performed.

In this embodiment, the substrate is introduced into an electric furnace, which is one of heat treatment apparatuses, and the oxide semiconductor film 113 is subjected to heat treatment at 450° C. in a nitrogen atmosphere for 1 hour and further at 450° C. in an atmosphere of nitrogen and oxygen for 1 hour.

Note that the heat treatment apparatus used is not limited to an electric furnace, and a device for heating a processing object by heat conduction or heat radiation from a heating element such as a resistance heating element may alternatively be used. For example, a rapid thermal annealing (RTA) apparatus such as a gas rapid thermal annealing (GRTA) apparatus or a lamp rapid thermal annealing (LRTA) apparatus can be used. An LRTA apparatus is an apparatus for heating a processing object by radiation of light (an electromagnetic wave) emitted from a lamp such as a halogen lamp, a metal halide lamp, a xenon arc lamp, a carbon arc lamp, a high-pressure sodium lamp, or a high-pressure mercury lamp. A GRTA apparatus is an apparatus for heat treatment using a high-temperature gas. As the high-temperature gas, an inert gas which does not react with a processing object by the heat treatment, such as nitrogen or a rare gas like argon, is used.

For example, as the heat treatment, GRTA may be performed as follows. The substrate is put in an inert gas heated at high temperature of 650° C. to 700° C., is heated for several minutes, and is taken out of the inert gas.

Note that in the heat treatment, it is preferable that moisture, hydrogen, and the like be not contained in nitrogen or a rare gas such as helium, neon, or argon. The purity of nitrogen or the rare gas such as helium, neon, or argon which is introduced into the heat treatment apparatus is preferably 6N (99.9999%) or higher, further preferably 7N (99.99999%) or higher (i.e., the impurity concentration is preferably 1 ppm or lower, further preferably 0.1 ppm or lower).

In addition, after the oxide semiconductor film 113 is heated by the heat treatment, a high-purity oxygen gas, a high-purity dinitrogen monoxide gas, or ultra dry air (the moisture amount is less than or equal to 20 ppm (−55° C. by conversion into a dew point), preferably less than or equal to 1 ppm, further preferably less than or equal to 10 ppb, according to measurement with a dew point meter of a cavity ring down laser spectroscopy (CRDS) system) may be introduced into the same furnace. It is preferable that water, hydrogen, or the like be not contained in the oxygen gas or the dinitrogen monoxide gas. The purity of the oxygen gas or the dinitrogen monoxide gas which is introduced into the heat treatment apparatus is preferably 6N or higher, further preferably 7N or higher (i.e., the impurity concentration in the oxygen gas or the dinitrogen monoxide gas is preferably 1 ppm or lower, further preferably 0.1 ppm or lower). The oxygen gas or the dinitrogen monoxide gas acts to supply oxygen that is a main component material of the oxide semiconductor and that is reduced by the step for removing an impurity for dehydration or dehydrogenation, so that the oxide semiconductor film 113 can be a high-purified, i-type (intrinsic) oxide semiconductor film.

Note that the timing of the heat treatment for dehydration or dehydrogenation may be after formation of the oxide semiconductor film or after formation of the island-shaped oxide semiconductor film 103 which is described later.

The heat treatment for dehydration or dehydrogenation may be performed plural times and may also serve as another heat treatment.

When the heat treatment for dehydration or dehydrogenation is performed in the state where the gate insulating film 102 is covered with the oxide semiconductor film 113 which has not been processed into the island-shaped oxide semiconductor film 103, oxygen included in the gate insulating film 102 can be prevented from being released by the heat treatment, which is preferable.

Further or alternatively, oxygen (which includes at least one of an oxygen radical, an oxygen atom, and an oxygen ion) may be introduced into the oxide semiconductor film 113 that has been subjected to the dehydration or dehydrogenation treatment in order to supply oxygen to the oxide semiconductor film 113. Here, oxygen can be introduced into the oxide semiconductor film 113 by an ion implantation method, an ion doping method, a plasma immersion ion implantation method, plasma treatment, or the like.

The introduction of oxygen into the oxide semiconductor film 113 is preferably performed after the dehydration or dehydrogenation treatment but not limited thereto. Further, oxygen may be introduced plural times into the oxide semiconductor film 113 subjected to the dehydration or dehydrogenation treatment.

It is preferable that the oxide semiconductor film in the transistor include a region containing oxygen in excess of the stoichiometric composition of the oxide semiconductor in a crystalline state. In this case, the amount of oxygen in the region exceeds that in the stoichiometric composition of the oxide semiconductor. Alternatively, the amount of oxygen in the region exceeds that of the oxide semiconductor in a single crystal state. In some cases, oxygen may exist between lattices of the oxide semiconductor.

As described above, the oxide semiconductor film 103 is preferably highly purified by sufficient removal of impurities such as hydrogen or sufficient supply with oxygen so as to be supersaturated with oxygen. Specifically, the hydrogen concentration in the oxide semiconductor film 103 is lower than or equal to $5\times10^{19}$ atoms/cm$^3$, preferably lower than or equal to $5\times10^{18}$ atoms/cm$^3$, further preferably lower than or equal to $5\times10^{17}$ atoms/cm$^3$.

By removing hydrogen or moisture from the oxide semiconductor to highly purify the oxide semiconductor so as not to contain impurities as much as possible, and supplying oxygen to fill oxygen vacancies therein, the oxide semiconductor can be turned into an i-type (intrinsic) oxide semiconductor or a substantially i-type (intrinsic) oxide semiconductor. This enables the Fermi level ($E_f$) of the oxide semiconductor to be at the same level as the intrinsic Fermi level ($E_i$) thereof. Accordingly, by using the oxide semiconductor film in a transistor, variation in the threshold voltage Vth of the transistor due to oxygen vacancies and a shift of the threshold voltage ΔVth can be reduced.

Figure 2B:
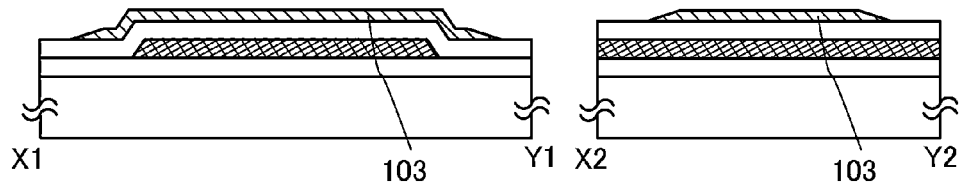

Next, the island-shaped oxide semiconductor film 103 can be formed by processing the oxide semiconductor film 113 into an island shape through a photolithography process (see FIG. 2B). Here, the island-shaped oxide semiconductor film 103 has a tapered end face portion, whose taper angle can be set as appropriate. For example, the taper angle can be set within 20° to 50°.

A resist mask which is used in the formation of the island-shaped oxide semiconductor film 103 may be formed by an ink-jet method. Formation of the resist mask by an inkjet method needs no photomask; thus, manufacturing cost can be reduced.

Note that the etching of the oxide semiconductor film may be dry etching, wet etching, or both dry etching and wet etching. As an etchant used for wet etching of the oxide semiconductor film, for example, a mixed solution of phosphoric acid, acetic acid, and nitric acid, or the like can be used. Alternatively, ITO-07N (produced by KANTO CHEMICAL CO., INC.) may be used. It is also possible to employ dry etching using an inductively coupled plasma (ICP) etching method.

Figure 2C:
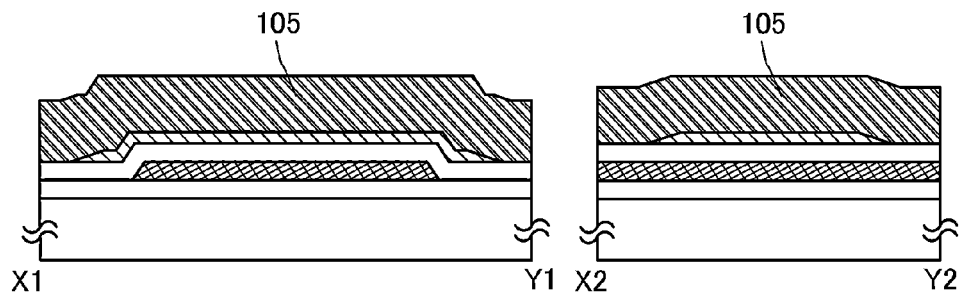

Next, a conductive film 105 which is to be a source electrode layer and a drain electrode layer (including a wiring formed in the same layer as the source electrode layer and the drain electrode layer) is formed over the gate electrode layer 101, the gate insulating film 102, and the oxide semiconductor film 103 (see FIG. 2C).

The conductive film 105 used for the source electrode layer and the drain electrode layer is formed using a material which can withstand heat treatment performed later. For example, a metal film containing an element selected from aluminum (Al), chromium (Cr), copper (Cu), tantalum (Ta), titanium (Ti), molybdenum (Mo), and tungsten (W), a metal nitride film containing any of the above elements as its component (e.g., a titanium nitride film, a molybdenum nitride film, or a tungsten nitride film), or the like can be used. It is also possible to use a structure in which a film of a high-melting-point metal such as Ti, Mo, or W or a metal nitride film thereof (e.g., a titanium nitride film, a molybdenum nitride film, or a tungsten nitride film) is stacked over and/or below a metal film of Al, Cu, or the like. Alternatively, the conductive film 105 used for the source electrode layer and the drain electrode layer may be formed using a conductive metal oxide. As the conductive metal oxide, indium oxide ($In_2O_3$), tin oxide ($SnO_2$), zinc oxide (ZnO), indium oxide-tin oxide ($In_2O_3$—$SnO_2$, abbreviated to ITO), indium oxide-zinc oxide ($In_2O_3$—ZnO), or any of these metal oxide materials containing silicon oxide can be used.

In this embodiment, a conductive film in which a 50-nm-thick titanium film, a 400-nm-thick aluminum film, and a 100-nm-thick titanium film are stacked in this order is formed by a sputtering method.

Figure 2D:
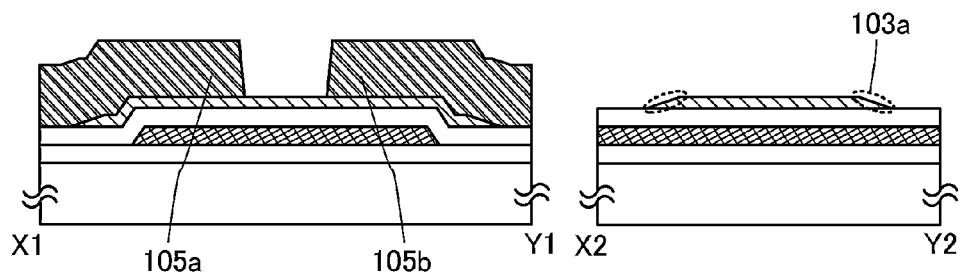

The conductive film 105 is selectively etched by a photolithography process to form the source electrode layer 105a and the drain electrode layer 105b (including a wiring formed in the same layer as the source electrode layer 105a and the drain electrode layer 105b) (see FIG. 2D). The source electrode layer 105a and the drain electrode layer 105b are formed by photolithography, and a resist mask used is removed after the formation.

Here, the source electrode layer 105a and the drain electrode layer 105b are provided to overlap with at least part of the gate electrode layer 101.

Ultraviolet light, KrF laser light, or ArF laser light is preferably used for light exposure for forming the resist mask. A channel length L of the transistor 140 that is to be completed in a later step is determined by a distance between a lower end of the source electrode layer 105a and a lower end of the drain electrode layer 105b that face each other over the oxide semiconductor film 103. In the case where the channel length L is less than 25 nm, the light exposure for forming the resist mask is preferably performed using extreme ultraviolet light having an extremely short wavelength of several nanometers to several tens of nanometers. In the light exposure by extreme ultraviolet light, the resolution is high and the focus depth is large. For these reasons, the channel length L of the transistor completed later can be greater than or equal to 10 nm and less than or equal to 1000 nm, and the operation speed of a circuit can increased.

The etching of the conductive film 105 for forming the source electrode layer 105a and the drain electrode layer 105b is performed by dry etching with the use of a gas containing halogen as an etching gas. For example, a parallel plate RIE (reactive ion etching) method or an ICP (inductively coupled plasma) etching method can be used. In order to etch the film into a desired shape, etching conditions (the amount of electric power applied to a coil-shaped electrode, the amount of electric power applied to an electrode on a substrate side, the temperature of the electrode on the substrate side, and the like) are adjusted as appropriate.

A gas containing chlorine such as a gas containing chlorine ($Cl_2$), boron trichloride ($BCl_3$), silicon tetrachloride ($SiCl_4$), or carbon tetrachloride ($CCl_4$) can be used as the gas containing halogen. Alternatively, a gas containing fluorine such as a gas containing carbon tetrafluoride ($CF_4$), sulfur hexafluoride ($SF_6$), nitrogen trifluoride ($NF_3$), trifluoromethane ($CHF_3$), or octafluorocyclobutane ($C_4F_8$) can be used as the gas containing halogen. Alternatively, any of the above-mentioned gases to which a rare gas such as helium (He) or argon (Ar) is added, or the like can be used.

In this embodiment, the conductive film 105, which is a stack of a titanium film, an aluminum film, and a titanium film, is etched by dry etching using $Cl_2$ and $BCl_3$ as an etching gas, whereby the source electrode layer 105a and the drain electrode layer 105b are formed.

When an etching gas containing halogen is used, the exposed region of the surface of the oxide semiconductor film 103 which does not overlap with the source electrode layer 105a or the drain electrode layer 105b, particularly the region 103a of the end face portion of the oxide semiconductor film 103 which does not overlap with the source electrode layer 105a or the drain electrode layer 105b is exposed to the etching gas. Thus, an impurity contained in the etching gas (an impurity of halogen such as chlorine or fluorine, an impurity of a Group 3 or Group 13 element such as boron, or an impurity of a Group 5 or Group 15 element such as nitrogen) is attached to or enters the region 103a. In such a case, electrons serving as carriers might be excessively generated in the region. Further, oxygen in the oxide semiconductor film 103 might be extracted by these impurities, so that oxygen vacancies might be formed on the surface of the oxide semiconductor film 103. As described above, oxygen vacancies are particularly likely to be formed in the end face portion of the oxide semiconductor film 103, which includes the region 103a, because oxygen is easily extracted. When carriers are generated owing to entry of impurities or formation of oxygen vacancies, the exposed surface of the oxide semiconductor film 103, particularly the region 103a has a reduced resistance (n-type conductivity), and a parasitic channel is likely to be formed.

Note that an element other than halogen (e.g., an impurity of a Group 3 or Group 13 element such as boron or an impurity of a Group 5 or Group 15 element such as nitrogen) in the etching gas containing halogen may also be a factor which causes the exposed surface of the oxide semiconductor film 103, particularly the region 103a to have a reduced resistance (n-type conductivity).

In view of the above, in this embodiment, the exposed region of the surface of the oxide semiconductor film 103 which does not overlap with the source electrode layer 105a or the drain electrode layer 105b, particularly the region 103a of the end face portion of the oxide semiconductor film 103 which does not overlap with the source electrode layer 105a or the drain electrode layer 105b is subjected to the impurity removal treatment and the oxygen addition treatment, which can suppress generation of carriers and prevent a reduction in resistance in the region.

Figure 3A:
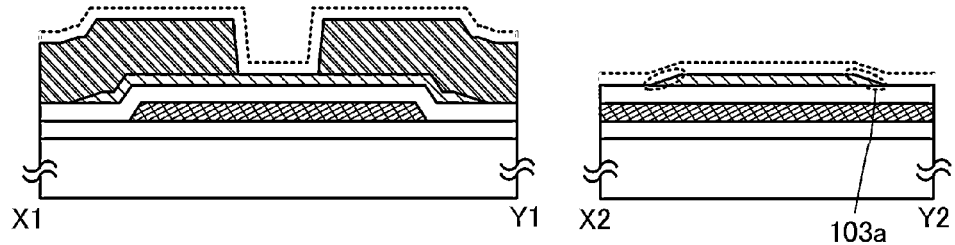
FIGS. 3A to 3D are cross-sectional views illustrating one embodiment of a method for manufacturing a semiconductor device.

As the impurity removal treatment, cleaning treatment using a solution can be performed on the exposed region of the surface of the oxide semiconductor film 103 which does not overlap with the source electrode layer 105a or the drain electrode layer 105b, particularly the region 103a of the end face portion of the oxide semiconductor film 103 which does not overlap with the source electrode layer 105a or the drain electrode layer 105b (see FIG. 3A).

Cleaning treatment with a dilute hydrofluoric acid solution is preferably employed as the cleaning treatment with a solution. For example, in the case where a dilute hydrofluoric acid solution is used, the dilution ratio of the dilute hydrofluoric acid is approximately $1:10^2$ to $1:10^5$, preferably approximately $1:10^3$ to $1:10^5$. Here, the exposed region of the surface of the oxide semiconductor film 103 which does not overlap with the source electrode layer 105a or the drain electrode layer 105b, particularly the region 103a, to which the above impurities are attached may be removed by etching. For example, when the IGZO film is processed using hydrofluoric acid which is diluted at a ratio of $1:10^3$ (0.05% hydrofluoric acid), the thickness is reduced by 1 nm to 3 nm per second; when the IGZO film is processed using hydrofluoric acid which is diluted at a ratio of $2:10^5$ (0.0025% hydrofluoric acid), the thickness is reduced by approximately 0.1 nm per second.

Alternatively, an oxalic acid solution may be used for the cleaning treatment using a solution. As the oxalic acid solution, for example, ITO-07N (produced by KANTO CHEMICAL CO., INC.) diluted with pure water may be used. Specifically, when the IGZO film is processed with ITO-07N which is diluted at a ratio of 1:100, the thickness is reduced by approximately 3.2 nm per minute.

After the impurity removal treatment by cleaning with a solution, heat treatment may be performed to remove water or the like that is adsorbed onto the surface of the oxide semiconductor film in the cleaning with a solution.

Such impurity removal treatment can remove or reduce impurities typified by an impurity of halogen such as chlorine or fluorine in the exposed region of the surface of the oxide semiconductor film 103 which does not overlap with the source electrode layer 105a or the drain electrode layer 105b, particularly in the region 103a. As specific impurity concentrations, the chlorine concentration in the region 103a can be lower than or equal to $5 \times 10^{18}$ atoms/$cm^3$ (preferably lower than or equal to $1 \times 10^{18}$ atoms/$cm^3$). The fluorine concentration in the region 103a can be lower than or equal to $5 \times 10^{18}$ atoms/$cm^3$ (preferably lower than or equal to $1 \times 10^{18}$ atoms/$cm^3$). The boron concentration in the region 103a can be lower than or equal to $5 \times 10^{16}$ atoms/$cm^3$ (preferably lower than or equal to $1 \times 10^{16}$ atoms/$cm^3$). The nitrogen concentration in the region 103a can be lower than $1 \times 10^{18}$ atoms/$cm^3$ (preferably lower than or equal to $1 \times 10^{17}$ atoms/$cm^3$). Note that the concentrations of the above impurities (e.g., boron, chlorine, and fluorine) in a region other than the region 103a in the oxide semiconductor film 103 are preferably lower than those in the region 103a.

Further, entry of an impurity such as magnesium, copper, or aluminum is preferably suppressed as well in the exposed region of the surface of the oxide semiconductor film 103 which does not overlap with the source electrode layer 105a or the drain electrode layer 105b, particularly in the region 103a. When an impurity such as magnesium, copper, or aluminum is scattered in the patterning for forming the source electrode layer 105a and the drain electrode layer 105b to be attached to the region 103a, the impurity generates carriers, which might lead to formation of a parasitic channel. Accordingly, the concentrations of the above impurities are preferably set as follows. The magnesium concentration is set lower than or equal to $1 \times 10^{17}$ atoms/cm$^3$ (preferably lower than or equal to $1 \times 10^{16}$ atoms/cm$^3$), the copper concentration is set lower than or equal to $1 \times 10^{18}$ atoms/cm$^3$ (preferably lower than or equal to $1 \times 10^{17}$ atoms/cm$^3$), and the aluminum concentration is set lower than or equal to $1 \times 10^{19}$ atoms/cm$^3$ (preferably lower than or equal to $1 \times 10^{18}$ atoms/cm$^3$).

Figure 3B:
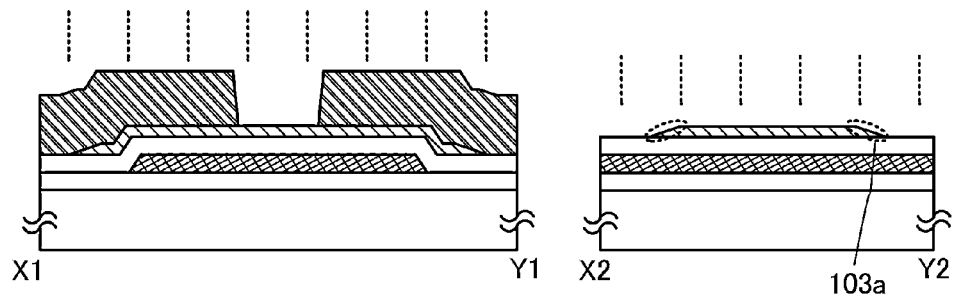

Next, the oxygen addition treatment is performed on the exposed region of the surface of the oxide semiconductor film 103 which does not overlap with the source electrode layer 105a or the drain electrode layer 105b, particularly the region 103a of the end face portion of the oxide semiconductor film 103 which does not overlap with the source electrode layer 105a or the drain electrode layer 105b (see FIG. 3B). The oxygen addition treatment can be performed by plasma treatment, preferably by plasma treatment performed in a dinitrogen monoxide atmosphere (hereinafter referred to as dinitrogen monoxide plasma treatment). Alternatively, plasma treatment in an oxygen atmosphere may be employed as the plasma treatment.

The dinitrogen monoxide plasma treatment is preferably performed with the substrate temperature set higher than or equal to room temperature and lower than or equal to 400° C., further preferably higher than or equal to 250° C. and lower than or equal to 400° C., still further preferably higher than or equal to 350° C. and lower than or equal to 400° C. For example, the dinitrogen monoxide plasma treatment can be performed under the following conditions: the atmosphere is an N$_2$O atmosphere (gas flow rate: 10 slm), the pressure is 20 Pa, the electric power is 150 W, and the substrate temperature is 400° C.

The dinitrogen monoxide plasma treatment can generate oxygen radicals relatively easily, so that oxygen can be easily supplied to the exposed region of the surface of the oxide semiconductor film 103 which does not overlap with the source electrode layer 105a or the drain electrode layer 105b, particularly the region 103a. Moreover, the above impurities and impurities such as hydrogen or water can be removed from the oxide semiconductor film 103 through the dinitrogen monoxide plasma treatment. For example, the hydrogen concentration of the oxide semiconductor film 103 can be lower than or equal to $5 \times 10^{19}$ atoms/cm$^3$, preferably lower than or equal to $5 \times 10^{18}$ atoms/cm$^3$, further preferably lower than or equal to $5 \times 10^{17}$ atoms/cm$^3$.

By thus performing the dinitrogen monoxide plasma treatment with the substrate temperature set higher than or equal to 250° C. and lower than or equal to 400° C., preferably higher than or equal to 350° C. and lower than or equal to 400° C., oxygen can be supplied to the oxide semiconductor film 103 with the diffusion coefficient of oxygen in the oxide semiconductor film 103 increased.

The above impurity removal treatment and oxygen addition treatment can reduce impurities and oxygen vacancies in the exposed region of the surface of the oxide semiconductor film 103 which does not overlap with the source electrode layer 105a or the drain electrode layer 105b, particularly the region 103a of the end face portion of the oxide semiconductor film 103 which does not overlap with the source electrode layer 105a or the drain electrode layer 105b, which can suppress generation of carriers in the region, thereby preventing degradation of the electric characteristics of the transistor 140. The transistor 140 can thus have favorable electric characteristics, so that a highly reliable semiconductor device can be provided.

Note that in some cases, oxygen vacancies are formed in the oxide semiconductor film 103 due to the above impurity removal treatment; however, the oxygen vacancies can be filled by the oxygen addition treatment performed after the impurity removal treatment as described above.

Next, the first protective insulating film 108 is formed to cover the oxide semiconductor film 103, the source electrode layer 105a, and the drain electrode layer 105b.

The first protective insulating film 108 can be formed by a plasma CVD method or a sputtering method. As the first protective insulating film 108, a single layer or a stack of one or more inorganic insulating films, typical examples of which are a silicon oxide film, a silicon oxynitride film, an aluminum oxide film, an aluminum oxynitride film, a hafnium oxide film, a gallium oxide film, a silicon nitride film, an aluminum nitride film, a silicon nitride oxide film, and an aluminum nitride oxide film, can be used. In this embodiment, a silicon oxynitride film is formed with a thickness of 400 nm by a CVD method. Use of a CVD method in this case enables the first protective insulating film 108 to be deposited faster, and thus can shorten the cycle time.

Alternatively, for example, a silicon oxide film may be formed as the first protective insulating film 108 by a sputtering method. In the silicon oxide film formed by a sputtering method, the oxygen content can be easily made larger than that in the stoichiometric composition; thus, even without oxygen addition treatment in a later step, oxygen can be supplied to the oxide semiconductor film 103 from the silicon oxide film.

Note that in the case of using a silicon-based insulating film as the first protective insulating film 108, a deposition chamber is generally cleaned before deposition. For such cleaning, a fluorine compound gas such as ClF$_3$ or NF$_3$ is often used. When a fluorine compound gas is used for the cleaning, an impurity such as fluorine contained in the gas is adsorbed onto the inner wall of the deposition chamber and might enter the oxide semiconductor film 103 at the time of forming the first protective insulating film 108. Therefore, it is preferable to introduce silane (SiH$_4$) or the like, instead of a fluorine compound gas, into the deposition chamber to perform the cleaning. In this manner, impurities which generate carriers in the oxide semiconductor film 103 can be reduced.

Figure 3C:
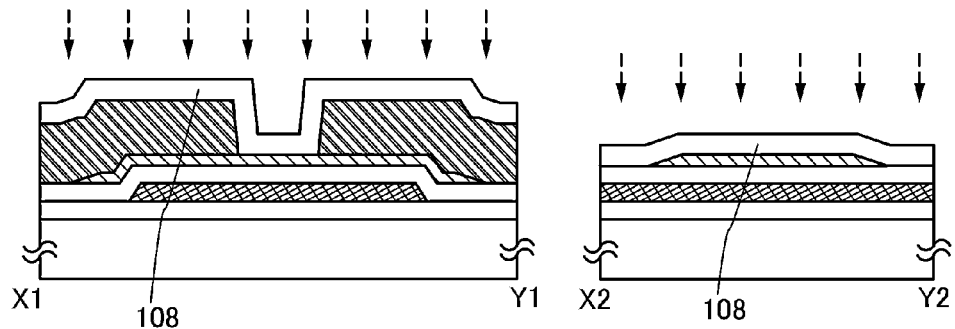

Next, the oxygen addition treatment is performed to supply oxygen (including at least one of an oxygen radical, an oxygen atom, and an oxygen ion) to at least the first protective insulating film 108 (see FIG. 3C).

For the oxygen addition treatment, an ion implantation method, an ion doping method, a plasma immersion ion implantation method, plasma treatment, or the like can be employed. A gas cluster ion beam may be used in the ion implantation method. The substrate may entirely be subjected to the oxygen addition treatment all at once, or may be subjected to the oxygen addition treatment with a moving linear ion beam or the like (by being scanned with the linear ion beam or the like).

For example, oxygen which is added may be supplied by a plasma generating apparatus with the use of a gas containing oxygen or by an ozone generating apparatus. More specifically, for example, oxygen can be generated with an apparatus for etching treatment on a semiconductor device, an apparatus for ashing on a resist mask, or the like to be supplied to the first protective insulating film 108.

A gas containing oxygen can be used for the oxygen addition treatment. As the gas containing oxygen, oxygen, dinitrogen monoxide, nitrogen dioxide, carbon dioxide, carbon monoxide, or the like can be used. Alternatively, a rare gas may be used for the oxygen addition treatment.

Such oxygen addition treatment can make the oxygen content in the film larger than that in the stoichiometric composition even when the first protective insulating film 108 is formed by a CVD method or the like.

Next, the second protective insulating film 109 is formed to cover the first protective insulating film 108. A dense inorganic insulating film, such as an aluminum oxide film or a silicon nitride film, is preferably used as the second protective insulating film 109. In this embodiment, an aluminum oxide film formed by a sputtering method is used. Note that the second protective insulating film 109 is not necessarily provided.

When the aluminum oxide film used as the second protective insulating film 109 has a high density (film density higher than or equal to 3.2 g/cm$^3$, preferably higher than or equal to 3.6 g/cm$^3$), the transistor 140 can have stable electric characteristics. Note that the film density can be measured by Rutherford backscattering spectrometry (RBS) or X-ray reflection (XRR).

The aluminum oxide film which can be used as the second protective insulating film 109 has a high shielding effect (blocking effect) of preventing penetration of both oxygen and an impurity such as hydrogen or moisture.

Thus, in and after the manufacturing process, the aluminum oxide film functions as a protective film for preventing entry of impurities such as hydrogen and moisture, which can cause a change in characteristics, into the oxide semiconductor film 103 and release of oxygen, which is a main component material of the oxide semiconductor, from the oxide semiconductor film 103.

Further, heat treatment may be performed after the formation of the second protective insulating film 109, so that the oxygen contained in the first protective insulating film 108, the amount of which exceeds that in the stoichiometric composition, can be supplied to the oxide semiconductor film 103.

The heat treatment is performed at higher than or equal to 250° C. and lower than or equal to 700° C., higher than or equal to 400° C. and lower than or equal to 700° C., or lower than the strain point of the substrate. For example, the substrate is put in an electric furnace which is a kind of heat treatment apparatus and heat treatment is performed at 250° C. in a nitrogen atmosphere for 1 hour.

In this case, the second protective insulating film 109 covers the first protective insulating film 108, which supplies oxygen, to prevent upward diffusion of oxygen from the first protective insulating film 108, so that oxygen can be supplied to the oxide semiconductor film 103.

By thus performing the heat treatment with the first protective insulating film 108 containing excess oxygen covered with the second protective insulating film 109 having a blocking effect, the oxide semiconductor film 103 can be put in a state where the proportion of oxygen substantially corresponds to that in the stoichiometric composition or a supersaturated state where the proportion of oxygen is higher than that in the stoichiometric composition. For example, when the oxide semiconductor film 103 is an IGZO film, an example of the stoichiometric composition is In:Ga:Zn:O=1:1:1:4 [atomic ratio]; thus, the atomic ratio of oxygen is four or more.

Figure 3D:
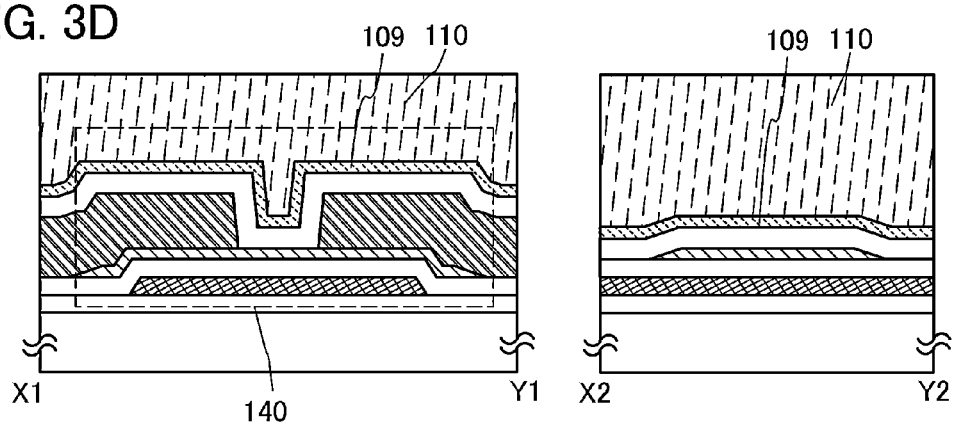

Through the above steps, the transistor 140 described in this embodiment is manufactured (see FIG. 3D).

In addition, the planarization insulating film 110 may be formed in order to reduce surface roughness caused by the transistor 140. For the planarization insulating film 110, an organic material such as a polyimide-based resin, an acrylic-based resin, or a benzocyclobutene-based resin can be used. Other than such organic materials, it is also possible to use a low-dielectric constant material (a low-k material) or the like. Note that the planarization insulating film 110 may be formed by stacking a plurality of insulating films formed using any of these materials.

For example, an acrylic resin film with a thickness of 1500 nm may be formed as the planarization insulating film 110. The acrylic resin film can be formed in such a manner that an acrylic resin is applied by a coating method and then baked (e.g., at 250° C. in a nitrogen atmosphere for 1 hour).

Heat treatment may be performed after the planarization insulating film 110 is formed. In this manner, heat treatment may be performed after the formation of the transistor 140. The heat treatment may be performed plural times.

As described above, the impurity removal treatment and the oxygen addition treatment are performed in manufacture of the semiconductor device including the oxide semiconductor film, whereby entry of an impurity of halogen such as chlorine (Cl) or fluorine (F), an impurity of a Group 3 or Group 13 element such as boron (B), or an impurity of a Group 5 or Group 15 element such as nitrogen (N) and formation of oxygen vacancies can be suppressed in the exposed region of the surface of the oxide semiconductor film 103 which does not overlap with the source electrode layer 105a or the drain electrode layer 105b, particularly in the region 103a. Specifically, the fluorine concentration in the region 103a can be lower than or equal to $5\times10^{18}$ atoms/cm$^3$ (preferably lower than or equal to $1\times10^{18}$ atoms/cm$^3$). The boron concentration in the region 103a can be lower than or equal to $5\times10^{16}$ atoms/cm$^3$ (preferably lower than or equal to $1\times10^{16}$ atoms/cm$^3$). The nitrogen concentration in the region 103a can be lower than $1\times10^{18}$ atoms/cm$^3$ (preferably lower than or equal to $1\times10^{17}$ atoms/cm$^3$). In this manner, impurities and oxygen vacancies are reduced in the region, so that generation of electrons serving as carriers can be suppressed.

Entry of impurities to the oxide semiconductor film 103 is thus suppressed, and further, oxygen vacancies are filled by the oxygen addition treatment, whereby the oxide semiconductor film 103 is put in a supersaturated state in which the proportion of oxygen is higher than that in the stoichiometric composition.

Consequently, a transistor including an oxide semiconductor and having favorable transistor characteristics can be provided. A highly reliable semiconductor device which includes a transistor including an oxide semiconductor film and having stable electric characteristics can be provided. Further, a highly reliable semiconductor device can be manufactured with a high yield, so that high productivity can be achieved.

Note that although the transistor 140 is an example of a bottom-gate transistor, this embodiment is not limited thereto. A transistor 150 which has a different structure from the transistor 140 is described using FIGS. 4A to 4C.

Figure 4A:
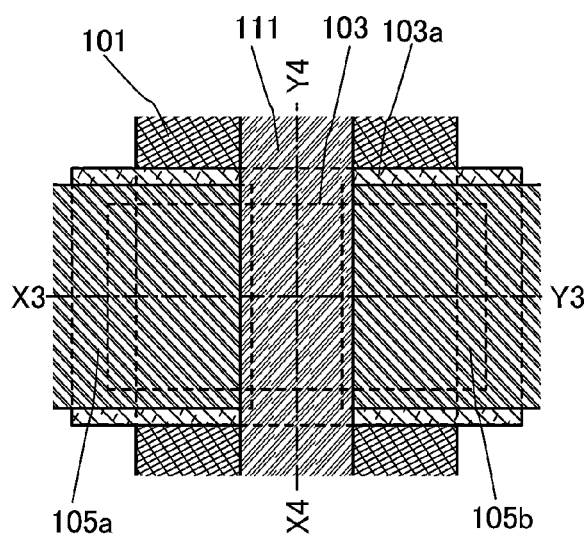
FIGS. 4A to 4C are a plan view and cross-sectional views which illustrate one embodiment of a semiconductor device.
Figure 4C:
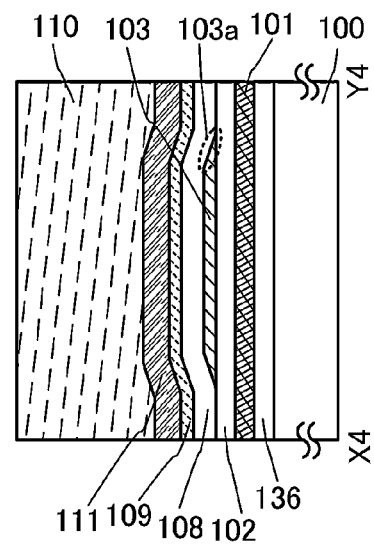
Figure 4B:
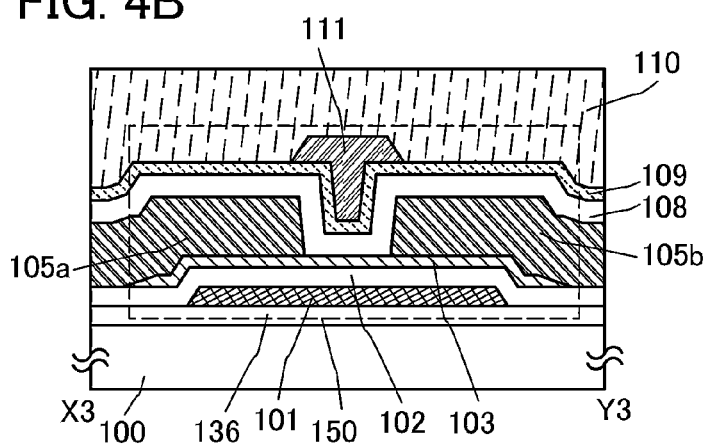

The transistor 150 in FIGS. 4A to 4C is an example of a dual-gate transistor including two gate electrode layers positioned above and below a channel formation region with a gate insulating film provided therebetween. Note that FIG. 4A is a plan view of the transistor 150. FIG. 4B is a cross-sectional view taken along line X3-Y3 in FIG. 4A. FIG. 4C is a cross-sectional view taken along line X4-Y4 in FIG. 4A.

As illustrated in FIGS. 4A to 4C, the transistor 150 is different from the transistor 140 in that a gate electrode layer 111 is provided over the second protective insulating film 109 to overlap with the oxide semiconductor film 103. The gate electrode layer 111 can be formed using a material and a method similar to those of the gate electrode layer 101; for details thereof, the description of the gate electrode layer 101 can be referred to.

The transistor 150 can be manufactured in a manner similar to that of the transistor 140 up to the step illustrated in FIG. 3D. In the step in FIG. 3D, the gate electrode layer 111 may be formed at least after the formation of the first protective insulating film 108.

Here, the first protective insulating film 108 and the second protective insulating film 109 function as gate insulating films for the gate electrode layer 111; thus, the materials of the first protective insulating film 108 and the second protective insulating film 109 can be determined as appropriate in accordance with the characteristics of the transistor 150.

Note that the other components of the transistor 150 are similar to those of the transistor 140; therefore, details of the components of the transistor 140 are referred to for those of the transistor 150.

The structures, methods, and the like described in this embodiment can be combined as appropriate with any of the structures, methods, and the like described in the other embodiments.

(Embodiment 2)

A semiconductor device having a display function (also referred to as a display device) can be manufactured using the transistor described in Embodiment 1. Further, part or all of the driver circuitry which includes the transistor can be formed over a substrate where a pixel portion is formed, whereby a system-on-panel can be formed.

Figure 5A:
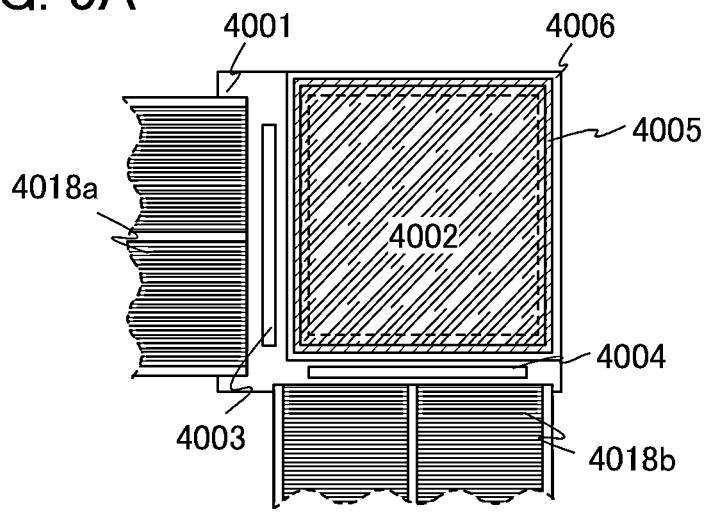
FIGS. 5A to 5C are plan views each illustrating one embodiment of a semiconductor device.

In FIG. 5A, a sealant 4005 is provided so as to surround a pixel portion 4002 provided over a first substrate 4001, and the pixel portion 4002 is sealed with a second substrate 4006. In FIG. 5A, a signal line driver circuit 4003 and a scan line driver circuit 4004 which are formed using a single crystal semiconductor film or a polycrystalline semiconductor film over a substrate separately prepared are mounted in a region that is different from the region surrounded by the sealant 4005 over the first substrate 4001. A variety of signals and potentials are supplied to the signal line driver circuit 4003 and the scan line driver circuit 4004 each of which is separately formed, and the pixel portion 4002 from flexible printed circuits (FPCs) 4018a and 4018b.

Figure 5B:
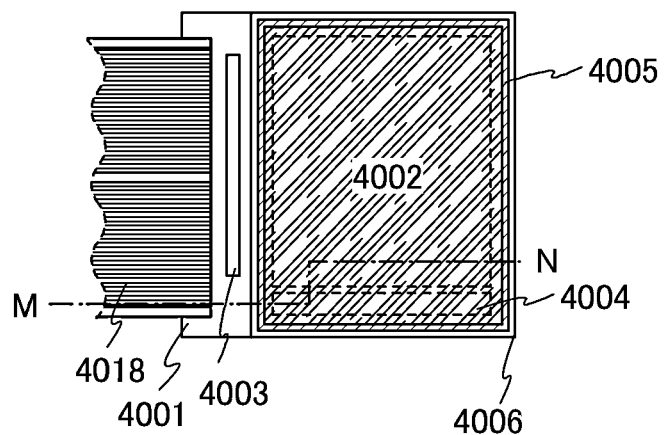
Figure 5C:
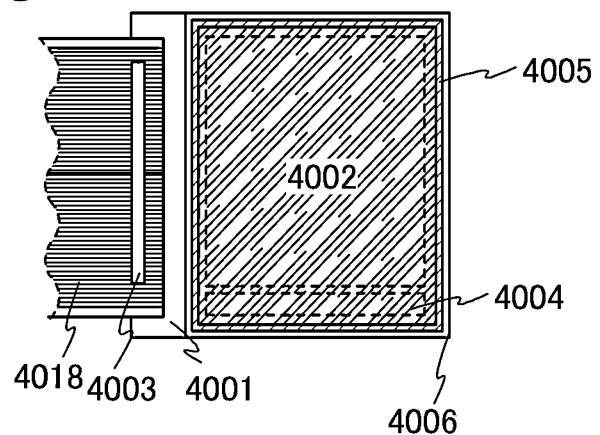

In FIGS. 5B and 5C, the sealant 4005 is provided so as to surround the pixel portion 4002 and the scan line driver circuit 4004 which are provided over the first substrate 4001. The second substrate 4006 is provided over the pixel portion 4002 and the scan line driver circuit 4004. Consequently, the pixel portion 4002 and the scan line driver circuit 4004 are sealed together with a display element, by the first substrate 4001, the sealant 4005, and the second substrate 4006. In FIGS. 5B and 5C, the signal line driver circuit 4003 which is formed using a single crystal semiconductor film or a polycrystalline semiconductor film over a substrate separately prepared is mounted in a region that is different from the region surrounded by the sealant 4005 over the first substrate 4001. In FIGS. 5B and 5C, a variety of signals and potentials are supplied to the signal line driver circuit 4003 which is separately formed, the scan line driver circuit 4004, and the pixel portion 4002 from an FPC 4018.

Although FIGS. 5B and 5C each illustrate an example in which the signal line driver circuit 4003 is formed separately and mounted on the first substrate 4001, one embodiment of the present invention is not limited to this structure. The scan line driver circuit may be formed separately and then mounted, or only part of the signal line driver circuit or part of the scan line driver circuit may be formed separately and then mounted.

Note that there is no particular limitation on a connection method of a separately formed driver circuit, and a chip on glass (COG) method, a wire bonding method, a tape automated bonding (TAB) method, or the like can be used. FIG. 5A illustrates an example in which the signal line driver circuit 4003 and the scan line driver circuit 4004 are mounted by a COG method. FIG. 5B illustrates an example in which the signal line driver circuit 4003 is mounted by a COG method. FIG. 5C illustrates an example in which the signal line driver circuit 4003 is mounted by a TAB method.

In addition, the display device includes a panel in which the display element is sealed, and a module in which an IC or the like including a controller is mounted on the panel.

Note that a display device in this specification means an image display device, a display device, or a light source (including a lighting device). Further, the display device also includes the following modules in its category: a module to which a connector such as an FPC, a TAB tape, or a TCP is attached; a module having a TAB tape or a TCP at the tip of which a printed wiring board is provided; and a module in which an integrated circuit (IC) is directly mounted on a display element by a COG method.

The pixel portion and the scan line driver circuit provided over the first substrate include a plurality of transistors, and the transistor described in Embodiment 1 can be applied thereto.

As the display element provided in the display device, a liquid crystal element (also referred to as a liquid crystal display element) or a light-emitting element (also referred to as a light-emitting display element) can be used. The light-emitting element includes, in its category, an element whose luminance is controlled by a current or a voltage, and specifically includes, in its category, an inorganic electroluminescent (EL) element, an organic EL element, and the like. Furthermore, a display medium whose contrast is changed by an electric effect, such as electronic ink, can be used.

Embodiments of the semiconductor device will be described with reference to FIGS. 5A to 5C, FIGS. 6A and 6B, and FIGS. 7A and 7B. FIGS. 7A and 7B correspond to cross-sectional views taken along line M-N in FIG. 5B.

As illustrated in FIGS. 5A to 5C and FIGS. 7A and 7B, the semiconductor device includes a connection terminal electrode 4015 and a terminal electrode 4016. The connection terminal electrode 4015 and the terminal electrode 4016 are electrically connected to a terminal included in the FPC 4018 through an anisotropic conductive film 4019.

The connection terminal electrode 4015 is formed using the same conductive film as a first electrode layer 4030, and the terminal electrode 4016 is formed using the same conductive film as source and drain electrode layers of transistors 4010 and 4011.

The pixel portion 4002 and the scan line driver circuit 4004 which are provided over the first substrate 4001 include a plurality of transistors. FIGS. 7A and 7B illustrate the transistor 4010 included in the pixel portion 4002 and the transistor 4011 included in the scan line driver circuit 4004. In FIG. 7A, a first protective insulating film 4020 and a second protective insulating film 4021 are provided over the transistors 4010 and 4011, and in FIG. 7B, an insulating film 4022 is further provided.

The transistor described in Embodiment 1 can be applied to the transistors 4010 and 4011. In this embodiment, an example in which a transistor having a structure similar to that of the transistor 140 described in Embodiment 1 is used is described. The transistors 4010 and 4011 are inverted staggered transistors with a bottom-gate structure.

In the transistors 4010 and 4011 which can be formed with a structure and a method similar to those of the transistor 140 described in Embodiment 1, impurities and oxygen vacancies in the exposed region of the surface of the oxide semiconductor film which does not overlap with the source electrode layer or the drain electrode layer, particularly the region of the end face portion of the oxide semiconductor film which does not overlap with the source electrode layer or the drain electrode layer are reduced, which can suppress generation of electrons serving as carriers in the region.

Accordingly, the semiconductor devices of this embodiment illustrated in FIGS. 5A to 5C and FIGS. 7A and 7B can be provided as highly reliable semiconductor devices including the transistors 4010 and 4011 each of which includes an oxide semiconductor film and has stable electric characteristics. Further, such a highly reliable semiconductor device can be manufactured with a high yield, so that high productivity can be achieved.

A conductive layer may be further provided so as to overlap with a channel formation region in the oxide semiconductor film of the transistor 4011 for the driver circuit. By providing the conductive layer so as to overlap with the channel formation region in the oxide semiconductor film, the amount of change in the threshold voltage of the transistor 4011 between before and after a bias-temperature stress test (BT test) can be further reduced. The conductive layer may have the same potential as or a potential different from that of a gate electrode layer of the transistor 4011, and can function as a second gate electrode layer. The potential of the conductive layer may be GND or 0 V, or the conductive layer may be in a floating state.

In addition, the conductive layer has a function of blocking an external electric field, that is, a function of preventing an external electric field (particularly, a function of preventing static electricity) from affecting the inside (a circuit portion including a transistor). The blocking function of the conductive layer can prevent fluctuation in the electric characteristics of the transistor due to an influence of an external electric field such as static electricity.

The transistor 4010 included in the pixel portion 4002 is electrically connected to a display element to form a display panel. There is no particular limitation on the kind of the display element as long as display can be performed, and various kinds of display elements can be employed.

FIG. 7A illustrates an example of a liquid crystal display device using a liquid crystal element as a display element. In FIG. 7A, a liquid crystal element 4013 which is a display element includes the first electrode layer 4030, a second electrode layer 4031, and a liquid crystal layer 4008. Insulating films 4032 and 4033 serving as alignment films are provided so that the liquid crystal layer 4008 is sandwiched therebetween. The second electrode layer 4031 is provided on the second substrate 4006 side, and the first electrode layer 4030 and the second electrode layer 4031 are stacked with the liquid crystal layer 4008 provided therebetween.

A spacer 4035 is a columnar spacer which is obtained by selective etching of an insulating film, and is provided in order to control the thickness of the liquid crystal layer 4008 (cell gap). Alternatively, a spherical spacer may be used.

In the case where a liquid crystal element is used as the display element, a thermotropic liquid crystal, a low-molecular liquid crystal, a high-molecular liquid crystal, a polymer dispersed liquid crystal, a ferroelectric liquid crystal, an antiferroelectric liquid crystal, or the like can be used. Such a liquid crystal material (liquid crystal composition) exhibits a cholesteric phase, a smectic phase, a cubic phase, a chiral nematic phase, an isotropic phase, or the like depending on conditions.

Alternatively, a liquid crystal composition exhibiting a blue phase for which an alignment film is unnecessary may be used for the liquid crystal layer 4008. In that case, the liquid crystal layer 4008 is in contact with the first electrode layer 4030 and the second electrode layer 4031. A blue phase is one of liquid crystal phases that is generated just before a cholesteric phase changes into an isotropic phase while the temperature of a cholesteric liquid crystal is increased. The blue phase can be exhibited using a liquid crystal composition which is a mixture of a liquid crystal and a chiral agent. To increase the temperature range where the blue phase is exhibited, a liquid crystal layer may be formed by adding a polymerizable monomer, a polymerization initiator, and the like to a liquid crystal composition exhibiting a blue phase and by performing polymer stabilization treatment. The liquid crystal composition exhibiting a blue phase has a short response time, and has optical isotropy, which contributes to the exclusion of the alignment process and reduction of viewing angle dependence. In addition, since an alignment film does not need to be provided and rubbing treatment is unnecessary, electrostatic discharge damage caused by the rubbing treatment can be prevented and defects and damage of the liquid crystal display device in the manufacturing process can be reduced. Thus, productivity of the liquid crystal display device can be improved. A transistor including an oxide semiconductor film has a possibility that the electric characteristics of the transistor may fluctuate significantly by the influence of static electricity and deviate from the designed range. Therefore, it is more effective to use a liquid crystal composition exhibiting a blue phase for the liquid crystal display device which includes the transistor including an oxide semiconductor film.

The specific resistivity of the liquid crystal material is higher than or equal to $1 \times 10^9$ Ω·cm, preferably higher than or equal to $1 \times 10^{11}$ Ω·cm, further preferably higher than or equal to $1 \times 10^{12}$ Ω·cm. Note that the specific resistivity in this specification is measured at 20° C.

The size of a storage capacitor in the liquid crystal display device is set considering the leakage current of the transistor provided in the pixel portion or the like so that charge can be held for a predetermined period. The size of the storage capacitor may be set considering the off-state current of the transistor or the like.

In the transistor including an oxide semiconductor film, which is disclosed in this specification, the current in an off state (off-state current) can be made small. Accordingly, an electric signal such as an image signal can be held for a longer period, and a writing interval can be set longer in an on state. Thus, the frequency of refresh operation can be reduced, which leads to an effect of suppressing power consumption.

The transistor including an oxide semiconductor film, which is disclosed in this specification, can have relatively high field-effect mobility and thus can operate at high speed. For example, when such a transistor which can operate at high speed is used for a liquid crystal display device, a switching transistor in a pixel portion and a driver transistor in a driver circuit portion can be formed over one substrate. That is, since a semiconductor device formed of a silicon wafer or the like is not additionally needed as a driver circuit, the number of components of the semiconductor device can be reduced. In addition, by using the transistor which can operate at high speed in the pixel portion, a high-quality image can be provided.

For the liquid crystal display device, a twisted nematic (TN) mode, an in-plane-switching (IPS) mode, a fringe field switching (FFS) mode, an axially symmetric aligned microcell (ASM) mode, an optical compensated birefringence (OCB) mode, a ferroelectric liquid crystal (FLC) mode, an anti-ferroelectric liquid crystal (AFLC) mode, or the like can be used.

A normally black liquid crystal display device such as a transmissive liquid crystal display device utilizing a vertical alignment (VA) mode may be used. Some examples are given as the vertical alignment mode. For example, a multi-domain vertical alignment (MVA) mode, a patterned vertical alignment (PVA) mode, or an advanced super view (ASV) mode can be used. This embodiment can also be applied to a VA liquid crystal display device. The VA liquid crystal display device has a kind of form in which alignment of liquid crystal molecules of a liquid crystal display panel is controlled. In the VA liquid crystal display device, liquid crystal molecules are aligned in a vertical direction with respect to a panel surface when no voltage is applied. Moreover, it is possible to use a method called domain multiplication or multi-domain design, in which a pixel is divided into some regions (subpixels) and molecules are aligned in different directions in their respective regions.

In the display device, a black matrix (light-blocking layer), an optical member (optical substrate) such as a polarizing member, a retardation member, or an anti-reflection member, and the like are provided as appropriate. For example, circular polarization may be obtained by using a polarizing substrate and a retardation substrate. In addition, a backlight, a side light, or the like may be used as a light source.

As a display method in the pixel portion, a progressive method, an interlace method or the like can be employed. Further, color elements controlled in a pixel at the time of color display are not limited to three colors: R, G, and B (R, G, and B correspond to red, green, and blue, respectively). For example, R, G, B, and W (W corresponds to white); or R, G, B, and one or more of yellow, cyan, magenta, and the like can be used. The sizes of display regions may differ between respective dots of color elements. Note that one embodiment of the invention disclosed herein is not limited to the application to a display device for color display; one embodiment of the invention disclosed herein can also be applied to a display device for monochrome display.

Alternatively, as the display element included in the display device, a light-emitting element utilizing electroluminescence can be used. Light-emitting elements utilizing electroluminescence are classified according to whether a light-emitting material is an organic compound or an inorganic compound. In general, the former is referred to as an organic EL element, and the latter is referred to as an inorganic EL element.

In an organic EL element, by application of voltage to the light-emitting element, electrons and holes are separately injected from a pair of electrodes into a layer containing a light-emitting organic compound, and current flows. The carriers (electrons and holes) are recombined, and thus, the light-emitting organic compound is excited. The light-emitting organic compound returns to a ground state from the excited state, thereby emitting light. Owing to such a mechanism, this light-emitting element is referred to as a current-excitation light-emitting element. In this embodiment, an example in which an organic EL element is used as the light-emitting element is described.

Inorganic EL elements are classified according to their element structures into a dispersion-type inorganic EL element and a thin-film inorganic EL element. A dispersion-type inorganic EL element has a light-emitting layer in which particles of a light-emitting material are dispersed in a binder, and its light emission mechanism is donor-acceptor recombination type light emission that utilizes a donor level and an acceptor level. A thin-film inorganic EL element has a structure where a light-emitting layer is sandwiched between dielectric layers, which are further sandwiched between electrodes, and its light emission mechanism is localized type light emission that utilizes inner-shell electron transition of metal ions. Note that an example of an organic EL element as a light-emitting element is described here.

To extract light emitted from the light-emitting element, at least one of the pair of electrodes has a light-transmitting property. A transistor and the light-emitting element are formed over a substrate. The light-emitting element can have any of the following structures: a top emission structure in which light emission is extracted through a surface opposite to the substrate; a bottom emission structure in which light emission is extracted through a surface on the substrate side; and a dual emission structure in which light emission is extracted through the surface opposite to the substrate and the surface on the substrate side.

Figure 6A:
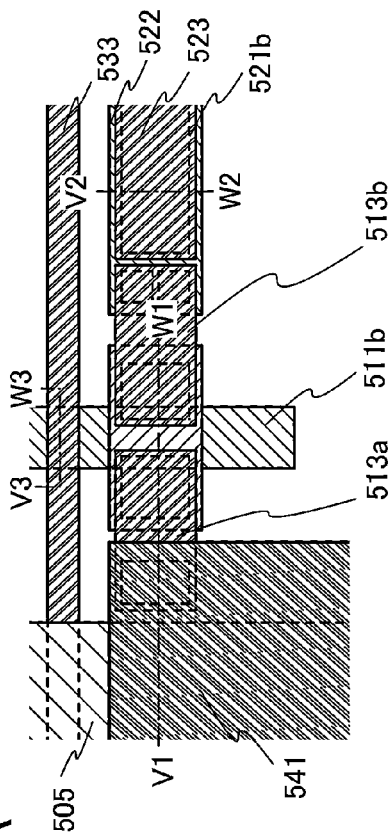
FIGS. 6A and 6B are a plan view and a cross-sectional view which illustrate one embodiment of a semiconductor device.
Figure 6B:
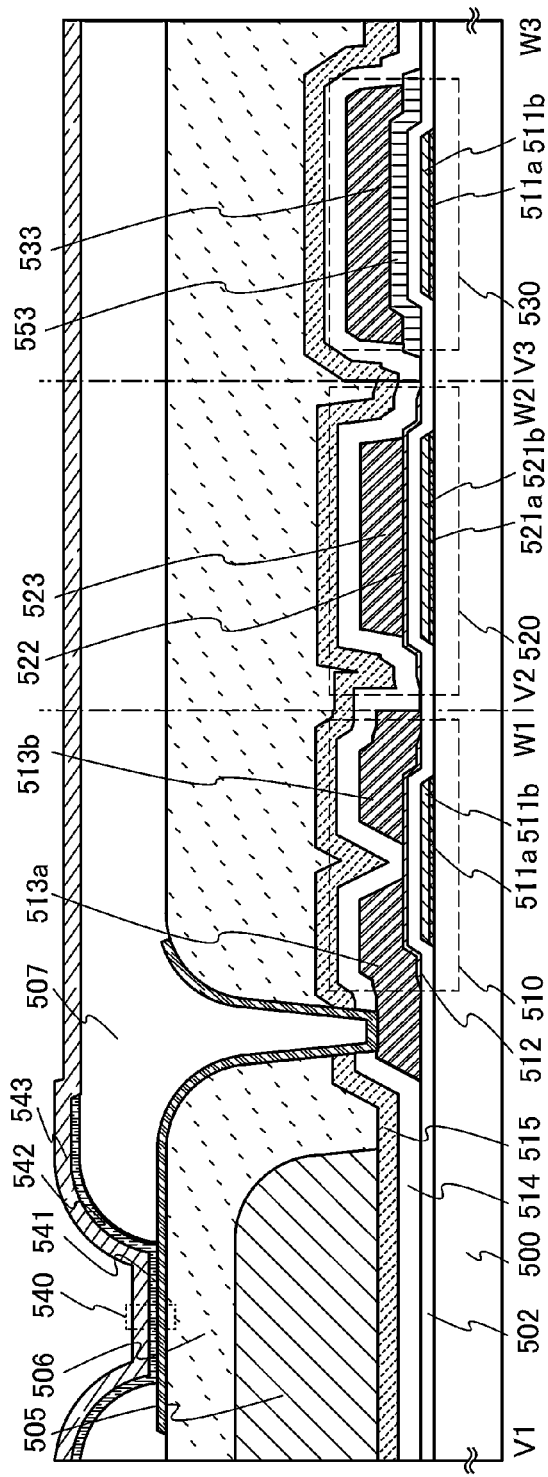

FIGS. 6A and 6B and FIG. 7B illustrate examples of a light-emitting device using a light-emitting element as a display element.

FIG. 6A is a plan view of a light-emitting device and FIG. 6B is a cross-sectional view taken along dashed-dotted lines V1-W1, V2-W2, and V3-W3 in FIG. 6A. Note that an electroluminescent layer 542 and a second electrode layer 543 are not illustrated in the plan view of FIG. 6A.

The light-emitting device illustrated in FIGS. 6A and 6B includes, over a substrate 500, a transistor 510, a capacitor 520, and a wiring layer intersection 530. The transistor 510 is electrically connected to a light-emitting element 540. Note that FIGS. 6A and 6B illustrate a bottom-emission light-emitting device in which light from the light-emitting element 540 is extracted through the substrate 500.

The transistor described in Embodiment 1 can be applied to the transistor 510. In this embodiment, an example in which a transistor having a structure similar to that of the transistor 140 described in Embodiment 1 is used is described. The transistor 510 is an inverted staggered transistor with a bottom-gate structure.

The transistor 510 includes gate electrode layers 511a and 511b, a gate insulating film 502, an oxide semiconductor film 512, and conductive layers 513a and 513b functioning as a source electrode layer and a drain electrode layer.

In the transistor 510 which can be formed with a structure and a method similar to those of the transistor 140 described in Embodiment 1, impurities and oxygen vacancies in the exposed region of the surface of the oxide semiconductor film which does not overlap with the source electrode layer or the drain electrode layer, particularly the region of the end face portion of the oxide semiconductor film which does not overlap with the source electrode layer or the drain electrode layer are reduced, which can suppress generation of electrons serving as carriers in the region.

Accordingly, the semiconductor device of this embodiment illustrated in FIGS. 6A and 6B can be provided as a highly reliable semiconductor device including the transistor 510 which includes an oxide semiconductor film and has stable electric characteristics. Further, such a highly reliable semiconductor device can be manufactured with a high yield, so that high productivity can be achieved.

The capacitor 520 includes conductive layers 521*a* and 521*b*, the gate insulating film 502, an oxide semiconductor film 522, and a conductive layer 523. The gate insulating film 502 and the oxide semiconductor film 522 are sandwiched between the conductive layer 523 and the conductive layers 521*a* and 521*b*, so that the capacitor is formed.

The wiring layer intersection 530 is an intersection of a conductive layer 533 and the gate electrode layers 511*a* and 511*b*. The conductive layer 533 and the gate electrode layers 511*a* and 511*b* intersect with each other with the gate insulating film 502 and an insulating layer 553 provided therebetween. In the structure described in this embodiment, not only the gate insulating film 502 but also the insulating layer 553 can be provided between the conductive layer 533 and the gate electrode layers 511*a* and 511*b* at the wiring layer intersection 530; thus, parasitic capacitance generated between the conductive layer 533 and the gate electrode layers 511*a* and 511*b* can be reduced.

In this embodiment, a 30-nm-thick titanium film is used as the gate electrode layer 511*a* and the conductive layer 521*a*, and a 200-nm-thick copper thin film is used as the gate electrode layer 511*b* and the conductive layer 521*b*. Thus, the gate electrode layer has a stacked-layer structure of a titanium film and a copper thin film.

A 25-nm-thick IGZO film is used as the oxide semiconductor films 512 and 522.

A first protective insulating film 514 and a second protective insulating film 515 are formed over the transistor 510, the capacitor 520, and the wiring layer intersection 530. Over the first protective insulating film 514 and the second protective insulating film 515, a color filter layer 505 is provided in a region overlapping with the light-emitting element 540. An insulating film 506 functioning as a planarization insulating film is provided over the first protective insulating film 514, the second protective insulating film 515, and the color filter layer 505.

The light-emitting element 540 having a stacked-layer structure in which a first electrode layer 541, the electroluminescent layer 542, and the second electrode layer 543 are stacked in that order is provided over the insulating film 506. The first electrode layer 541 is in contact with the conductive layer 513*a* in an opening formed in the insulating film 506, the first protective insulating film 514, and the second protective insulating film 515, which reaches the conductive layer 513*a*, whereby the light-emitting element 540 is electrically connected to the transistor 510. Note that a partition 507 is provided so as to cover part of the first electrode layer 541 and the opening.

As the first protective insulating film 514, a silicon oxynitride film having a thickness greater than or equal to 200 nm and less than or equal to 600 nm, which is formed by a plasma CVD method can be used. As the second protective insulating film 515, an aluminum oxide film formed by a sputtering method can be used. Further, a photosensitive acrylic film having a thickness of 1500 nm and a photosensitive polyimide film having a thickness of 1500 nm can be used as the insulating film 506 and the partition 507, respectively.

As the color filter layer 505, for example, a chromatic light-transmitting resin can be used. As such a chromatic light-transmitting resin, a photosensitive organic resin or a nonphotosensitive organic resin can be used. A photosensitive organic resin layer is preferably used, because the number of resist masks can be reduced, leading to simplification of a process.

Chromatic colors are colors except achromatic colors such as black, gray, and white. The color filter layer is formed using a material which transmits only light of the chromatic color. As the chromatic color, red, green, blue, or the like can be used. Cyan, magenta, yellow, or the like may also be used. "Transmitting only light of the chromatic color" means that the light transmitted through the color filter layer has a peak at a wavelength of light of the chromatic color. The thickness of the color filter layer may be controlled to be optimal as appropriate in consideration of the relationship between the concentration of a coloring material to be contained and the transmittance of light. For example, the color filter layer 505 may have a thickness greater than or equal to 1500 nm and less than or equal to 2000 nm.

In the light-emitting device illustrated in FIG. 7B, a light-emitting element 4513 which is a display element is electrically connected to the transistor 4010 provided in the pixel portion 4002. A structure of the light-emitting element 4513 is not limited to the shown stacked-layer structure including the first electrode layer 4030, an electroluminescent layer 4511, and the second electrode layer 4031. The structure of the light-emitting element 4513 can be changed as appropriate depending on a direction in which light is extracted from the light-emitting element 4513, or the like.

Partitions 4510 and 507 can be formed using an organic insulating material or an inorganic insulating material. It is particularly preferable that the partitions 4510 and 507 be formed using a photosensitive resin material to have openings over the first electrode layers 4030 and 541, respectively. A sidewall of each opening is formed as a tilted surface with continuous curvature.

The electroluminescent layers 4511 and 542 may be formed using either a single layer or a plurality of layers stacked.

A protective film may be formed over the second electrode layer 4031 and the partition 4510 and over the second electrode layer 543 and the partition 507 in order to prevent entry of oxygen, hydrogen, moisture, carbon dioxide, and the like into the light-emitting elements 4513 and 540. As the protective film, a silicon nitride film, a silicon nitride oxide film, a DLC film, or the like can be formed.

Further, the light-emitting elements 4513 and 540 may be covered with respective layers containing an organic compound deposited by an evaporation method so that oxygen, hydrogen, moisture, carbon dioxide, and the like do not enter the light-emitting elements 4513 and 540.

In addition, in a space which is formed with the first substrate 4001, the second substrate 4006, and the sealant 4005, a filler 4514 is provided for sealing. It is preferable that a panel be packaged (sealed) with a protective film (such as a laminate film or an ultraviolet curable resin film) or a cover material with high air-tightness and little degasification so that the panel is not exposed to the outside air, in this manner.

As the filler 4514, an ultraviolet curable resin or a thermosetting resin can be used as well as an inert gas such as nitrogen or argon. For example, polyvinyl chloride (PVC), acrylic, polyimide, an epoxy resin, a silicone resin, polyvinyl butyral (PVB), or ethylene vinyl acetate (EVA) can be used. For example, nitrogen is used for the filler.

In addition, as needed, an optical film such as a polarizing plate, a circularly polarizing plate (including an elliptically polarizing plate), a retardation plate (a quarter-wave plate or a half-wave plate), or a color filter may be provided as appropriate on a light-emitting surface of the light-emitting element. Further, the polarizing plate or the circularly polarizing plate may be provided with an anti-reflection film. For example, anti-glare treatment by which reflected light can be diffused by projections and depressions on the surface so as to reduce the glare can be performed.

Further, an electronic paper in which electronic ink is driven can be provided as the display device. The electronic paper is also referred to as an electrophoretic display device (an electrophoretic display) and is advantageous in that it has the same level of readability as plain paper, it has lower power consumption than other display devices, and it can be made thin and lightweight.

An electrophoretic display device can have various modes. An electrophoretic display device contains a plurality of microcapsules dispersed in a solvent or a solute, each microcapsule containing first particles which are positively charged and second particles which are negatively charged. By applying an electric field to the microcapsules, the particles in the microcapsules move in opposite directions to each other and only the color of the particles gathering on one side is displayed. Note that the first particles and the second particles each contain pigment and do not move without an electric field. Moreover, the first particles and the second particles have different colors (which may be colorless).

Thus, an electrophoretic display device is a display device that utilizes a so-called dielectrophoretic effect by which a substance having a high dielectric constant moves to a high-electric field region.

A solution in which the above microcapsules are dispersed in a solvent is referred to as electronic ink. This electronic ink can be printed on a surface of glass, plastic, cloth, paper, or the like. Furthermore, by using a color filter or particles that have a pigment, color display can also be achieved.

Note that the first particles and the second particles in the microcapsules may each be formed of a single material selected from a conductive material, an insulating material, a semiconductor material, a magnetic material, a liquid crystal material, a ferroelectric material, an electroluminescent material, an electrochromic material, and a magnetophoretic material, or formed of a composite material of any of these.

As the electronic paper, a display device using a twisting ball display system can be used. The twisting ball display system refers to a method in which spherical particles each colored in black and white are arranged between a first electrode layer and a second electrode layer which are electrode layers used for a display element, and a potential difference is generated between the first electrode layer and the second electrode layer to control orientation of the spherical particles, so that display is performed.

In FIGS. 5A to 5C, FIGS. 6A and 6B, and FIGS. 7A and 7B, a flexible substrate as well as a glass substrate can be used as any of the first substrates 4001 and 500 and the second substrate 4006. For example, a plastic substrate having a light-transmitting property or the like can be used. As the plastic substrate, a fiberglass-reinforced plastics (FRP) plate, a polyvinyl fluoride (PVF) film, a polyester film, or an acrylic resin film can be used. In the case where a light-transmitting property is not needed, a metal substrate (metal film) of aluminum, stainless steel, or the like may be used. For example, a sheet with a structure in which an aluminum foil is sandwiched between PVF films or polyester films can be used.

In this embodiment, a silicon oxynitride film formed by a plasma CVD method is used as the first protective insulating film 4020, and an aluminum oxide film formed by a sputtering method is used as the second protective insulating film 4021.

The aluminum oxide film provided as the second protective insulating film 4021 over the oxide semiconductor film has a high shielding effect (blocking effect) of preventing penetration of both oxygen and impurities such as hydrogen and moisture.

Thus, in and after the manufacturing process, the aluminum oxide film functions as a protective film for preventing entry of impurities such as hydrogen and moisture, which can cause a change in characteristics, into the oxide semiconductor film and release of oxygen, which is a main component material of the oxide semiconductor, from the oxide semiconductor film.

The insulating films 4022 and 506 serving as planarization insulating films can be formed using an organic material having heat resistance, such as acrylic, polyimide, a benzocyclobutene-based resin, polyamide, or epoxy. Other than such organic materials, it is also possible to use a low-dielectric constant material (a low-k material), a siloxane-based resin, phosphosilicate glass (PSG), borophosphosilicate glass (BPSG), or the like. Note that the insulating films may be formed by stacking a plurality of insulating films formed using any of these materials.

There is no particular limitation on the methods of forming the insulating films 4022 and 506, and the following method or tool (equipment) can be used depending on the material: a sputtering method, an SOG method, spin coating, dipping, spray coating, a droplet discharge method (such as an inkjet method), a printing method (such as screen printing or offset printing), a doctor knife, a roll coater, a curtain coater, a knife coater, or the like.

The display device displays an image with light transmitted from a light source or a display element. Therefore, the substrate and the thin films such as the insulating film and the conductive film provided for the pixel portion where light is transmitted have light-transmitting properties with respect to light in the visible-light wavelength range.

The first electrode layer and the second electrode layer (each of which may be called a pixel electrode layer, a common electrode layer, a counter electrode layer, or the like) for applying voltage to the display element may have light-transmitting properties or light-reflecting properties, which depends on the direction in which light is extracted, the position where the electrode layer is provided, and the pattern structure of the electrode layer.

The first electrode layers 4030 and 541 and the second electrode layers 4031 and 543 can be formed using a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, indium tin oxide to which silicon oxide is added, or graphene.

The first electrode layers 4030 and 541 and the second electrode layers 4031 and 543 can be formed using one or plural kinds selected from metals such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), and silver (Ag); alloys thereof; and nitrides thereof.

In this embodiment, since the light-emitting device illustrated in FIGS. 6A and 6B has a bottom-emission structure, the first electrode layer 541 has a light-transmitting property and the second electrode layer 543 has a light-reflecting property. Accordingly, in the case of using a metal film as the first electrode layer 541, the film is preferably thin enough to secure a light-transmitting property; and in the case of using a light-transmissive conductive film as the second electrode layer 543, a conductive film having a light-reflecting property is preferably stacked therewith.

A conductive composition containing a conductive high molecule (also referred to as a conductive polymer) can be used for the first electrode layers 4030 and 541 and the second electrode layers 4031 and 543. As the conductive high molecule, a so-called π-electron conjugated conductive polymer can be used. For example, polyaniline or a derivative thereof, polypyrrole or a derivative thereof, polythiophene or a derivative thereof, a copolymer of two or more of aniline, pyrrole, and thiophene or a derivative thereof can be given.

Since the transistor is easily broken owing to static electricity or the like, a protection circuit for protecting the driver circuit is preferably provided. The protection circuit is preferably formed using a nonlinear element.

By using the transistor described in Embodiment 1 as described above, the semiconductor device can have a variety of functions.

The structures, methods, and the like described in this embodiment can be combined as appropriate with any of the structures, methods, and the like described in the other embodiments.

(Embodiment 3)

A semiconductor device having an image sensor function of reading information on an object can be manufactured using the transistor described in Embodiment 1.

Figure 8A:
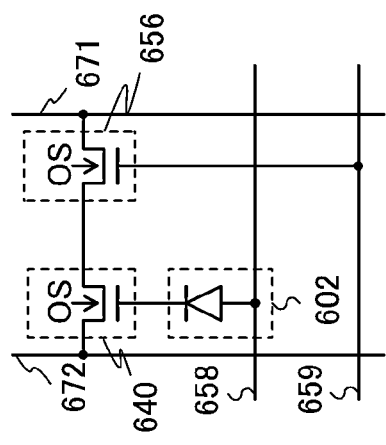
FIGS. 8A and 8B are a circuit diagram and a cross-sectional view illustrating one embodiment of a semiconductor device.

FIG. 8A illustrates an example of a semiconductor device having an image sensor function. FIG. 8A is an equivalent circuit diagram of a photosensor, and FIG. 8B is a cross-sectional view of part of the photosensor.

One electrode of a photodiode 602 is electrically connected to a photodiode reset signal line 658, and the other electrode of the photodiode 602 is electrically connected to a gate of a transistor 640. One of a source and a drain of the transistor 640 is electrically connected to a photosensor reference signal line 672, and the other of the source and the drain of the transistor 640 is electrically connected to one of a source and a drain of a transistor 656. A gate of the transistor 656 is electrically connected to a gate signal line 659, and the other of the source and the drain of the transistor 656 is electrically connected to a photosensor output signal line 671.

Note that in a circuit diagram in this specification, a transistor including an oxide semiconductor film is denoted by a symbol "OS" so that it can be identified as a transistor including an oxide semiconductor film. In FIG. 8A, the transistor 640 and the transistor 656 are each a transistor including an oxide semiconductor film, to which the transistor described in Embodiment 1 can be applied. Described in this embodiment is an example in which a transistor having a structure similar to that of the transistor 140 described in Embodiment 1 is used. The transistor 640 is an inverted staggered transistor with a bottom-gate structure, in which an insulating layer functioning as a channel protective film is provided over an oxide semiconductor film.

Figure 8B:
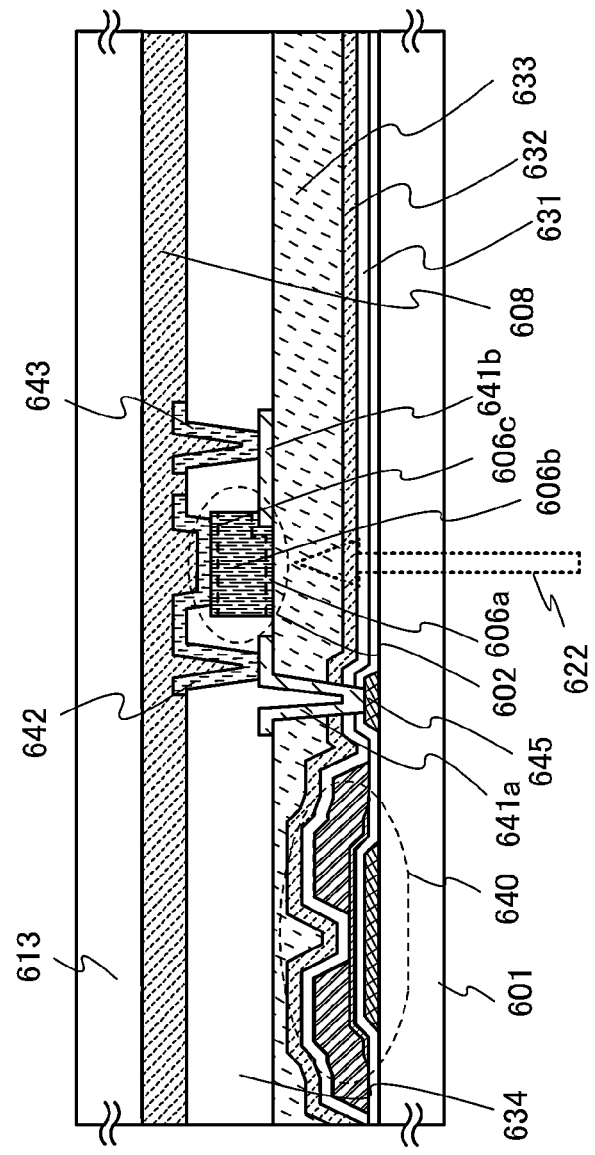

FIG. 8B is a cross-sectional view of the photodiode 602 and the transistor 640 in the photosensor. The photodiode 602 functioning as a sensor and the transistor 640 are provided over a substrate 601 (TFT substrate) having an insulating surface. A substrate 613 is provided over the photodiode 602 and the transistor 640 with the use of an adhesive layer 608.

A first protective insulating film 631, a second protective insulating film 632, an interlayer insulating film 633, and an interlayer insulating film 634 are provided over the transistor 640. The photodiode 602 is provided over the interlayer insulating film 633. In the photodiode 602, a first semiconductor film 606a, a second semiconductor film 606b, and a third semiconductor film 606c are stacked in this order from the interlayer insulating film 633 side, between electrode layers 641a and 641b formed over the interlayer insulating film 633 and an electrode layer 642 formed over the interlayer insulating film 634.

The electrode layer 641b is electrically connected to a conductive layer 643 formed over the interlayer insulating film 634, and the electrode layer 642 is electrically connected to a conductive layer 645 through the electrode layer 641a. The conductive layer 645 is electrically connected to the gate electrode layer of the transistor 640, and the photodiode 602 is electrically connected to the transistor 640.

Here, a pin photodiode in which a semiconductor film having p-type conductivity as the first semiconductor film 606a, a high-resistance semiconductor film (i-type semiconductor film) as the second semiconductor film 606b, and a semiconductor film having n-type conductivity as the third semiconductor film 606c are stacked is illustrated as an example.

The first semiconductor film 606a is a p-type semiconductor film and can be formed using an amorphous silicon film containing an impurity element imparting p-type conductivity. The first semiconductor film 606a is formed by a plasma CVD method with the use of a semiconductor source gas containing an impurity element belonging to Group 13 (e.g., boron (B)). As the semiconductor source gas, silane ($SiH_4$) may be used. Alternatively, $Si_2H_6$, $SiH_2Cl_2$, $SiHCl_3$, $SiCl_4$, $SiF_4$, or the like may be used. Further alternatively, an amorphous silicon film which does not contain an impurity element may be formed, and then an impurity element may be introduced into the amorphous silicon film by a diffusion method or an ion implantation method. Heating or the like may be conducted after introducing the impurity element by an ion implantation method or the like in order to diffuse the impurity element. In this case, as a method for forming the amorphous silicon film, an LPCVD method, a vapor deposition method, a sputtering method, or the like may be used. The first semiconductor film 606a is preferably formed to have a thickness greater than or equal to 10 nm and less than or equal to 50 nm.

The second semiconductor film 606b is an i-type semiconductor film (intrinsic semiconductor film) and is formed using an amorphous silicon film. As for formation of the second semiconductor film 606b, an amorphous silicon film is formed by a plasma CVD method with the use of a semiconductor source gas. As the semiconductor source gas, silane ($SiH_4$) may be used. Alternatively, $Si_2H_6$, $SiH_2Cl_2$, $SiHCl_3$, $SiCl_4$, $SiF_4$, or the like may be used. The second semiconductor film 606b may be formed by an LPCVD method, a vapor deposition method, a sputtering method, or the like. The second semiconductor film 606b is preferably formed to have a thickness greater than or equal to 200 nm and less than or equal to 1000 nm.

The third semiconductor film 606c is an n-type semiconductor film and is formed using an amorphous silicon film containing an impurity element imparting n-type conductivity. The third semiconductor film 606c is formed by a plasma CVD method with the use of a semiconductor source gas containing an impurity element belonging to Group 15 (e.g., phosphorus (P)). As the semiconductor source gas, silane ($SiH_4$) may be used. Alternatively, $Si_2H_6$, $SiH_2Cl_2$, $SiHCl_3$, $SiCl_4$, $SiF_4$, or the like may be used. Further alternatively, an amorphous silicon film which does not contain an impurity element may be formed, and then an impurity element may be introduced into the amorphous silicon film by a diffusion method or an ion implantation method. Heating or the like may be conducted after introducing the impurity element by an ion implantation method or the like in order to diffuse the impurity element. In this case, as a method for forming the amorphous silicon film, an LPCVD method, a vapor deposition method, a sputtering method, or the like may be used. The third semiconductor film 606c is preferably formed to have a thickness greater than or equal to 20 nm and less than or equal to 200 nm.

The first semiconductor film 606a, the second semiconductor film 606b, and the third semiconductor film 606c are not necessarily formed using an amorphous semiconductor, and may be formed using a polycrystalline semiconductor or a microcrystalline semiconductor (semi-amorphous semiconductor: SAS).

The mobility of holes generated by the photoelectric effect is lower than the mobility of electrons. Thus, a pin photodiode has better characteristics when a surface on the p-type semiconductor film side is used as a light-receiving plane. Here, an example in which light 622 received by the photodiode 602 from a surface of the substrate 601, over which the pin photodiode is formed, is converted into electric signals is described. Further, light from the semiconductor film having a conductivity type opposite to that of the semiconductor film on the light-receiving plane is disturbance light; therefore, the electrode layer is preferably formed using a light-blocking conductive film. Note that a surface on the n-type semiconductor film side can alternatively be used as the light-receiving plane.

The first protective insulating film 631, the second protective insulating film 632, the interlayer insulating film 633, and the interlayer insulating film 634 can be formed using an insulating material by a sputtering method, a plasma CVD method, an SOG method, spin coating, dipping, spray coating, a droplet discharge method (such as an inkjet method), a printing method (such as screen printing or offset printing), or the like depending on the material.

The first protective insulating film 631 and the second protective insulating film 632 can be formed using an inorganic insulating material and can have a single-layer structure or a stacked-layer structure including any of oxide insulating films such as a silicon oxide layer, a silicon oxynitride layer, an aluminum oxide layer, and an aluminum oxynitride layer, and nitride insulating films such as a silicon nitride layer, a silicon nitride oxide layer, an aluminum nitride layer, and an aluminum nitride oxide layer.

In this embodiment, a silicon oxynitride film formed by a plasma CVD method is used as the first protective insulating film 631, and an aluminum oxide film formed by a sputtering method is used as the second protective insulating film 632.

The aluminum oxide film provided as the second protective insulating film 632 over the oxide semiconductor film has a high shielding effect (blocking effect) of preventing penetration of both oxygen and impurities such as hydrogen and moisture.

Thus, in and after the manufacturing process, the aluminum oxide film functions as a protective film for preventing entry of impurities such as hydrogen and moisture, which can cause a change in characteristics, into the oxide semiconductor film and release of oxygen, which is a main component material of the oxide semiconductor, from the oxide semiconductor film.

To reduce surface roughness, an insulating film functioning as a planarization insulating film is preferably used as each of the interlayer insulating films 633 and 634. For the interlayer insulating films 633 and 634, for example, an organic insulating material having heat resistance, such as polyimide, an acrylic resin, a benzocyclobutene resin, polyamide, or an epoxy resin, can be used. Other than such organic insulating materials, it is possible to use a single layer or stacked layers of a low-dielectric constant material (a low-k material), a siloxane-based resin, phosphosilicate glass (PSG), borophosphosilicate glass (BPSG), or the like.

With detection of light 622 that enters the photodiode 602, information on an object to be detected can be read. Note that a light source such as a backlight can be used at the time of reading information on an object to be detected.

In the transistor 640 which can be formed with a structure and a method similar to those of the transistor 140 described in Embodiment 1, impurities and oxygen vacancies in the exposed region of the surface of the oxide semiconductor film which does not overlap with the source electrode layer or the drain electrode layer, particularly the region of the end face portion of the oxide semiconductor film which does not overlap with the source electrode layer or the drain electrode layer are reduced, which can suppress generation of electrons serving as carriers in the region.

Accordingly, the semiconductor device of this embodiment illustrated in FIGS. 8A and 8B can be provided as a highly reliable semiconductor device including the transistor 640 which includes an oxide semiconductor film and has stable electric characteristics. Further, such a highly reliable semiconductor device can be manufactured with a high yield, so that high productivity can be achieved.

The structures, methods, and the like described in this embodiment can be combined as appropriate with any of the structures, methods, and the like described in the other embodiments.

(Embodiment 4)

A semiconductor device disclosed in this specification can be applied to a variety of electronic devices (including game machines). Examples of electronic devices include a television set (also referred to as a television or a television receiver), a monitor of a computer or the like, cameras such as a digital camera and a digital video camera, a digital photo frame, a mobile phone, a portable game machine, a portable information terminal, an audio reproducing device, a game machine (e.g., a pachinko machine or a slot machine), a game console, and the like. Specific examples of these electronic devices are illustrated in FIGS. 9A to 9C.

Figure 9A:
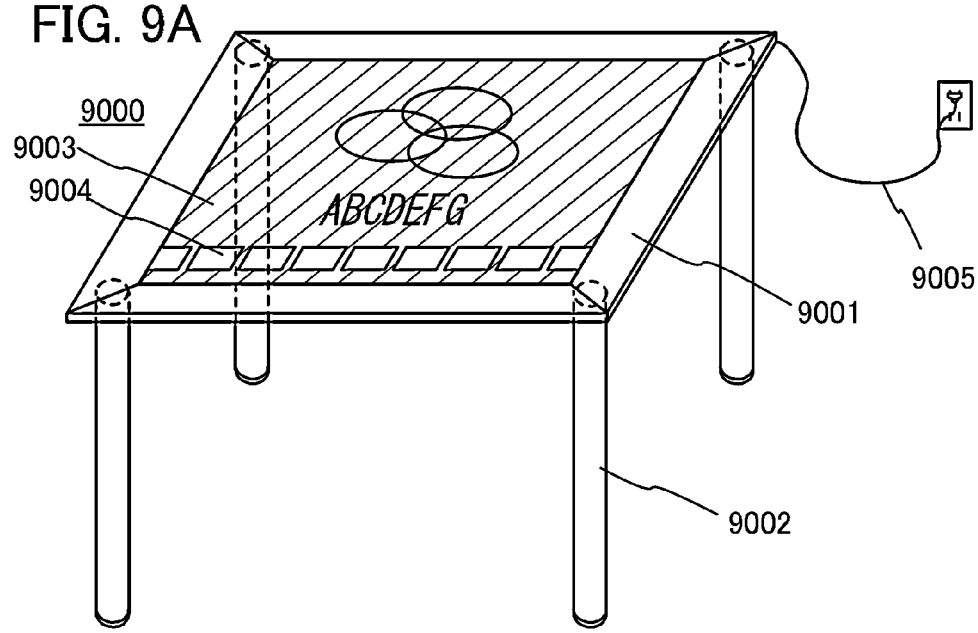
FIGS. 9A to 9C each illustrate an electronic device.
Figure 9B:
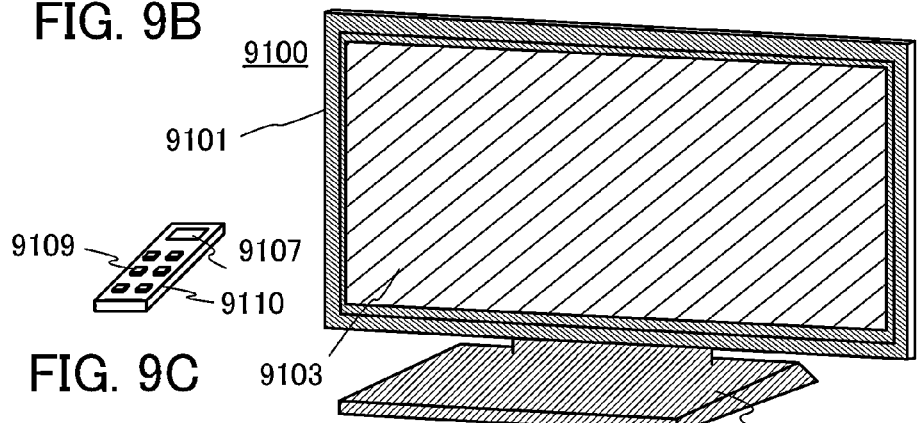
Figure 9C:
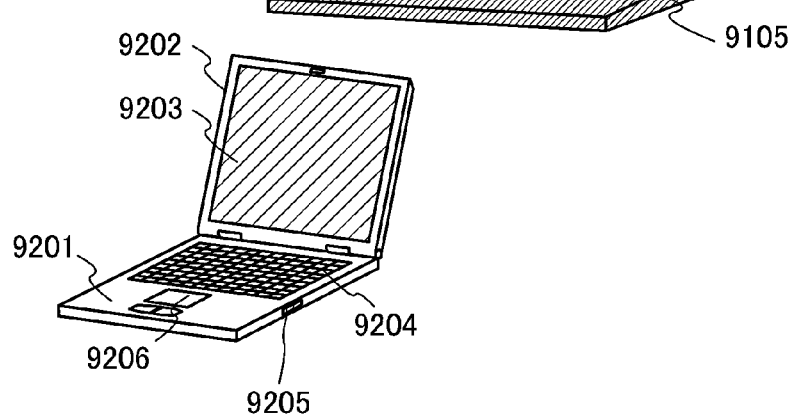

FIG. 9A illustrates a table 9000 having a display portion. In the table 9000, a display portion 9003 is incorporated in a housing 9001 and an image can be displayed on the display portion 9003. Note that the housing 9001 is supported by four leg portions 9002. Further, a power cord 9005 for supplying power is provided for the housing 9001.

The semiconductor device described in any of Embodiments 1 to 3 can be used for the display portion 9003 so that the electronic device can have a high reliability.

The display portion 9003 has a touch-input function. When a user touches displayed buttons 9004 which are displayed on the display portion 9003 of the table 9000 with his/her finger or the like, the user can carry out operation of the screen and input of information. Further, when the table may be made to communicate with home appliances or control the home appliances, the display portion 9003 may function as a control device which controls the home appliances by operation on the screen. For example, with the use of the semiconductor device having an image sensor function described in Embodiment 3, the display portion 9003 can have a touch-input function.

Further, the screen of the display portion 9003 can be placed perpendicular to a floor with a hinge provided for the housing 9001; thus, the table 9000 can also be used as a television set. When a television set having a large screen is set in a small room, an open space is reduced; however, when a display portion is incorporated in a table, a space in the room can be efficiently used.

FIG. 9B illustrates a television set 9100. In the television set 9100, a display portion 9103 is incorporated in a housing 9101 and an image can be displayed on the display portion 9103. Note that the housing 9101 is supported by a stand 9105 here.

The television set 9100 can be operated with an operation switch of the housing 9101 or a separate remote controller 9110. Channels and volume can be controlled with an operation key 9109 of the remote controller 9110 so that an image displayed on the display portion 9103 can be controlled. Furthermore, the remote controller 9110 may be provided with a display portion 9107 for displaying data output from the remote controller 9110.

The television set 9100 illustrated in FIG. 9B is provided with a receiver, a modem, and the like. With the receiver, the television set 9100 can receive general TV broadcasts. Further, the television set 9100 can be connected to a communication network with or without wires via the modem, which enables one-way (from sender to receiver) or two-way (between sender and receiver or between receivers) data communication.

The semiconductor device described in any of Embodiments 1 to 3 can be used for the display portions 9103 and 9107, whereby the television set and the remote controller can be provided with high reliability.

FIG. 9C illustrates a computer which includes a main body 9201, a housing 9202, a display portion 9203, a keyboard 9204, an external connection port 9205, a pointing device 9206, and the like.

The semiconductor device described in any of Embodiments 1 to 3 can be used for the display portion 9203, whereby the computer can be provided with high reliability.

Figure 10A:
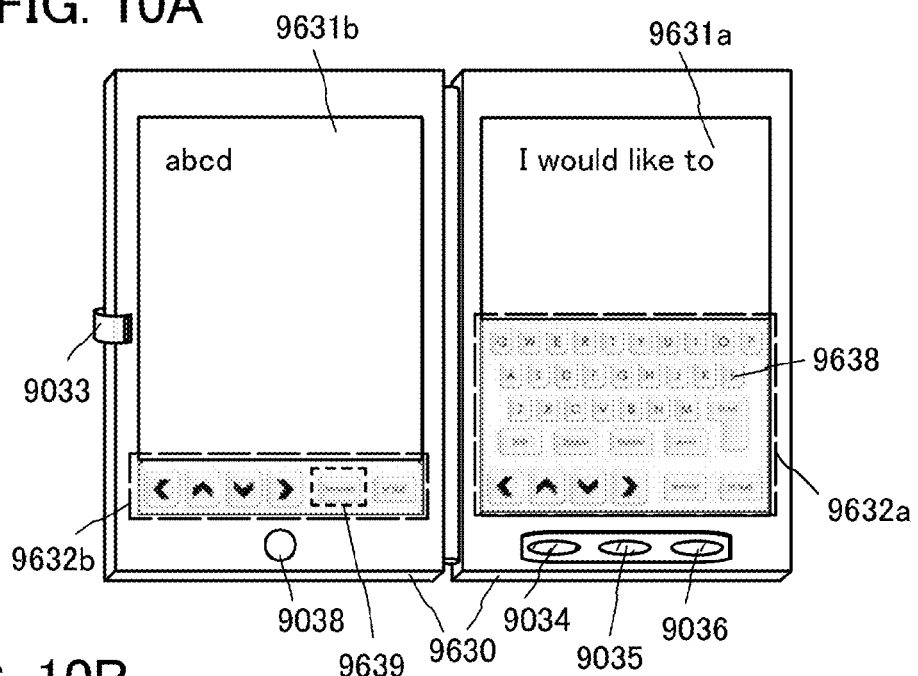
FIGS. 10A to 10C illustrate an electronic device.
Figure 10B:
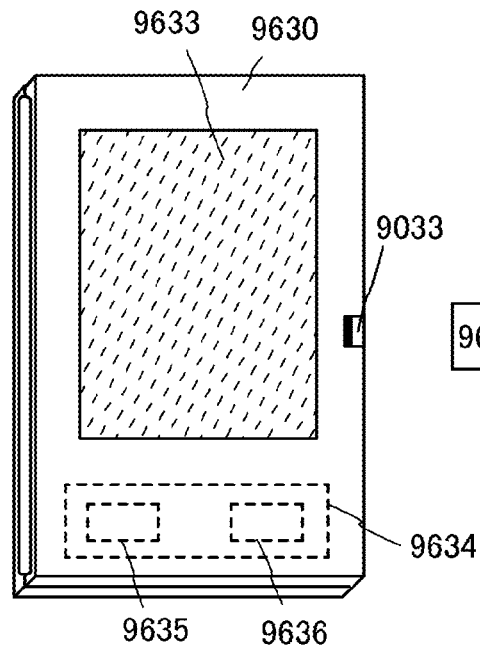

FIGS. 10A and 10B illustrate a tablet terminal that can be folded. In FIG. 10A, the tablet terminal is opened, and includes a housing 9630, a display portion 9631a, a display portion 9631b, a display-mode switching button 9034, a power button 9035, a power-saving-mode switching button 9036, a clip 9033, and an operation button 9038.

The semiconductor device described in any of Embodiments 1 to 3 can be used for the display portion 9631a and the display portion 9631b, whereby the tablet terminal can be provided with high reliability.

A touch panel area 9632a can be provided in a part of the display portion 9631a, in which data can be input by touching displayed operation keys 9638. Note that FIG. 10A shows, as an example, that half of the area of the display portion 9631a has only a display function and the other half of the area has a touch panel function. However, one embodiment of the present invention is not limited to this structure, and the whole display portion 9631a may have a touch panel function. For example, the display portion 9631a can display a keyboard in the whole region to be used as a touch panel, and the display portion 9631b can be used as a display screen.

A touch panel area 9632b can be provided in part of the display portion 9631b like in the display portion 9631a. When a keyboard display switching button 9639 displayed on the touch panel is touched with a finger, a stylus, or the like, a keyboard can be displayed on the display portion 9631b.

Touch input can be performed concurrently on the touch panel area 9632a and the touch panel area 9632b.

The display-mode switching button 9034 allows switching between a landscape mode and a portrait mode, color display and black-and-white display, and the like. With the power-saving-mode switching button 9036, the luminance of display can be optimized in accordance with the amount of external light at the time when the tablet is in use, which is detected with an optical sensor incorporated in the tablet. The tablet terminal may include another detection device such as a sensor for detecting inclination (e.g., a gyroscope or an acceleration sensor) in addition to the optical sensor.

Although the display portion 9631a and the display portion 9631b have the same display area in FIG. 10A, one embodiment of the present invention is not limited to this structure. The display portion 9631a and the display portion 9631b may have different areas or different display quality. For example, one of them may be a display panel that can display higher-definition images than the other.

In FIG. 10B, the tablet terminal is folded, and includes the housing 9630, a solar battery 9633, a charge and discharge control circuit 9634, a battery 9635, and a DCDC converter 9636. FIG. 10B illustrates an example in which the charge and discharge control circuit 9634 includes the battery 9635 and the DCDC converter 9636.

Since the tablet terminal can be folded, the housing 9630 can be closed when not in use. Thus, the display portion 9631a and the display portion 9631b can be protected, which makes it possible to provide a tablet terminal with excellent durability and excellent reliability for long-term use.

The tablet terminal illustrated in FIGS. 10A and 10B can also have a function of displaying various kinds of data (e.g., a still image, a moving image, and a text image), a function of displaying a calendar, a date, the time, or the like on the display portion, a touch input function of operating or editing data displayed on the display portion by touch input, a function of controlling processing by various kinds of software (programs), and the like.

The solar battery 9633, which is attached on the surface of the tablet terminal, supplies electric power to a touch panel, a display portion, an image signal processor, and the like. Note that the solar battery 9633 can be provided on one or both surfaces of the housing 9630, so that the battery 9635 can be charged efficiently. The use of a lithium ion battery as the battery 9635 is advantageous in downsizing or the like.

Figure 10C:
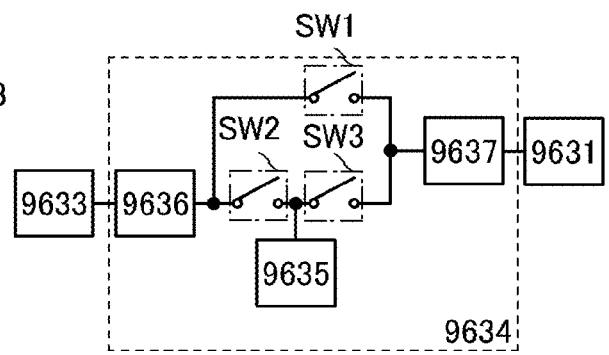

The structure and operation of the charge and discharge control circuit 9634 illustrated in FIG. 10B are described with reference to a block diagram of FIG. 10C. FIG. 10C illustrates the solar battery 9633, the battery 9635, the DCDC converter 9636, a converter 9637, switches SW1 to SW3, and the display portion 9631. The battery 9635, the DCDC converter 9636, the converter 9637, and the switches SW1 to SW3 correspond to the charge and discharge control circuit 9634 in FIG. 10B.

First, an example of operation in the case where power is generated by the solar battery 9633 using external light is described. The voltage of power generated by the solar battery 9633 is raised or lowered by the DCDC converter 9636 to a voltage needed for charging the battery 9635. When the display portion 9631 is operated with the power from the solar battery 9633, the switch SW1 is turned on and the voltage of the power is raised or lowered by the converter 9637 to a voltage needed for operating the display portion 9631. In addition, when display on the display portion 9631 is not performed, the switch SW1 is turned off and a switch SW2 is turned on so that charge of the battery 9635 may be performed.

Here, the solar battery 9633 is described as an example of a power generation means; however, there is no particular limitation on a way of charging the battery 9635, and the battery 9635 may be charged with any other power generation means such as a piezoelectric element or a thermoelectric conversion element (Peltier element). For example, the battery 9635 may be charged with a non-contact power transmission module that transmits and receives power wirelessly (without contact) to charge the battery or with a combination of other charging means.

The structures, methods, and the like described in this embodiment can be combined as appropriate with any of the structures, methods, and the like described in the other embodiments.

This application is based on Japanese Patent Application serial no. 2011-263751 filed with Japan Patent Office on Dec. 1, 2011, the entire contents of which are hereby incorporated by reference.

What is claimed is:

1. A method for manufacturing a semiconductor device, comprising the steps of:
    forming a gate electrode layer over a substrate having an insulating surface;
    forming a gate insulating film over the gate electrode layer;
    forming an oxide semiconductor film having a tapered end face portion over the gate insulating film, wherein the oxide semiconductor film is a c-axis aligned crystalline oxide semiconductor;
    forming a conductive film over the oxide semiconductor film;
    etching the conductive film with an etching gas comprising halogen to form a source electrode layer and a drain electrode layer each overlapping with the gate electrode layer and a part of the tapered end face portion;
    removing an element contained in the etching gas from the exposed rest of the tapered end face portion after etching the conductive film;
    adding oxygen to the exposed rest of the tapered end face portion after etching the conductive film; and
    forming a first protective insulating film over the oxide semiconductor film, the source electrode layer, and the drain electrode layer.

2. The method for manufacturing the semiconductor device according to claim 1, wherein the etching step is performed by a plasma treatment.

3. The method for manufacturing the semiconductor device according to claim 1, further comprising the step of adding oxygen to the first protective insulating film after forming the first protective insulating film.

4. The method for manufacturing the semiconductor device according to claim 3, further comprising the step of forming a second protective insulating film comprising aluminum oxide over the first protective insulating film.

5. The method for manufacturing the semiconductor device according to claim 1, wherein the oxide semiconductor film comprises indium, zinc and one or more metal elements selected from gallium, aluminum, manganese, cobalt, tin, hafnium, and zirconium.

6. A method for manufacturing a semiconductor device, comprising the steps of:
    forming an oxide semiconductor film having a tapered end face portion over a substrate having an insulating surface, wherein the oxide semiconductor film is a c-axis aligned crystalline oxide semiconductor;
    forming a conductive film over the oxide semiconductor film;
    etching the conductive film with an etching gas comprising halogen to form a source electrode layer and a drain electrode layer each overlapping with a part of the tapered end face portion;
    removing an element contained in the etching gas from the exposed rest of the tapered end face portion after etching the conductive film;
    adding oxygen to the exposed rest of the tapered end face portion after etching the conductive film; and
    forming a first protective insulating film over the oxide semiconductor film, the source electrode layer, and the drain electrode layer.

7. The method for manufacturing the semiconductor device according to claim 6, wherein the etching step is performed by a plasma treatment.

8. The method for manufacturing the semiconductor device according to claim 6, further comprising the step of adding oxygen to the first protective insulating film after forming the first protective insulating film.

9. The method for manufacturing the semiconductor device according to claim 8, further comprising the step of forming a second protective insulating film comprising aluminum oxide over the first protective insulating film.

10. The method for manufacturing the semiconductor device according to claim 6, wherein the oxide semiconductor film comprises indium, zinc, and one or more metal elements selected from gallium, aluminum, manganese, cobalt, tin, hafnium, and zirconium.

11. The method for manufacturing the semiconductor device according to claim 1, wherein a chlorine concentration in the exposed rest of the tapered end face portion is lower than or equal to $5\times10^{18}$ atoms/cm$^3$.

12. The method for manufacturing the semiconductor device according to claim 6, wherein a chlorine concentration in the exposed rest of the tapered end face portion is lower than or equal to $5\times10^{18}$ atoms/cm$^3$.

13. The method for manufacturing the semiconductor device according to claim 1,
    wherein a concentration of the element in the part of the tapered end face portion is lower than a concentration of the element in the exposed rest of the tapered end face portion, and
    wherein the element is one of chlorine and fluorine.

14. The method for manufacturing the semiconductor device according to claim 6,
    wherein a concentration of the element in the part of the tapered end face portion is lower than a concentration of the element in the exposed rest of the tapered end face portion, and
    wherein the element is one of chlorine and fluorine.

* * * * *